(12) United States Patent
Driscoll et al.

(10) Patent No.: US 6,843,657 B2
(45) Date of Patent: Jan. 18, 2005

(54) HIGH SPEED, HIGH DENSITY INTERCONNECT SYSTEM FOR DIFFERENTIAL AND SINGLE-ENDED TRANSMISSION APPLICATIONS

(75) Inventors: Michael P. Driscoll, Deep River, CT (US); Stephen Vetter, Straffod, MO (US); Robert M. Bradley, Oakville, MO (US)

(73) Assignee: Litton Systems Inc., Los Angeles, CA (US)

(*) Notice: Subject to any disclaimer, the term of this patent is extended or adjusted under 35 U.S.C. 154(b) by 9 days.

(21) Appl. No.: 10/036,796

(22) Filed: Jan. 7, 2002

(65) Prior Publication Data

US 2002/0094705 A1 Jul. 18, 2002

Related U.S. Application Data

(60) Provisional application No. 60/260,893, filed on Jan. 12, 2001, and provisional application No. 60/328,396, filed on Oct. 12, 2001.

(51) Int. Cl.[7] ............................................... H01R 12/00
(52) U.S. Cl. ..................... 439/65; 439/289; 439/579; 439/953
(58) Field of Search ........................... 634/65, 24, 378, 634/153, 608, 289, 579, 953

(56) References Cited

U.S. PATENT DOCUMENTS

| | | | |
|---|---|---|---|
| 3,035,244 A | 5/1962 | Aveni | |
| 3,208,028 A | 9/1965 | Mittler et al. | |
| 3,432,801 A | 3/1969 | Ruotolo | |
| 3,564,343 A | 2/1971 | Guest et al. | |
| 3,761,842 A | 9/1973 | Gandrud | |
| 3,825,874 A | * 7/1974 | Peverill | 439/579 |
| 4,008,941 A | 2/1977 | Smith | |

(List continued on next page.)

FOREIGN PATENT DOCUMENTS

| | | |
|---|---|---|
| EP | 0284245 A1 | 9/1988 |
| EP | 0 422 785 A2 | 4/1991 |
| EP | 0 442 643 A2 | 8/1991 |
| EP | 0 446 980 A1 | 9/1991 |
| EP | 0 488 482 A1 | 6/1992 |
| EP | 0583934 A2 | 2/1994 |
| EP | 0 654 859 A1 | 5/1995 |
| EP | 0 752 739 A1 | 1/1997 |
| EP | 1087466 A2 | 3/2001 |
| GB | 2 344471 A | 10/1999 |
| GB | 2371686 A | 7/2001 |
| WO | WO 94/16474 | 7/1994 |
| WO | WO 97/02627 | 1/1997 |
| WO | WO97/18603 A1 | 5/1997 |
| WO | WO00/24092 A1 | 4/2000 |

Primary Examiner—P. Austin Bradley
Assistant Examiner—Xuong Chung-Trans
(74) Attorney, Agent, or Firm—Rothwell, Figg, Ernst & Manbeck

(57) ABSTRACT

The present invention is directed to a high density electrical connector which can provide 80 or more twinax connections per linear inch in a 20 millimeter card slot. In a typical electronic system package, 20 millimeters is the spacing from center line to center line of the adjacent parallel daughtercards. Twinax cable is coaxial cable that contains two inner conducting wires rather than one. The two inner conducting wires provide two physical channels. Coaxial cable is called "coaxial" because it includes one physical channel that carries the signal surrounded (after a layer of insulation) by another concentric physical channel, both running along the same axis. The outer channel serves as ground.

28 Claims, 27 Drawing Sheets

U.S. PATENT DOCUMENTS

| | | | |
|---|---|---|---|
| 4,017,770 A | 4/1977 | Valfre | |
| 4,148,543 A | 4/1979 | Shores | |
| 4,157,612 A | 6/1979 | Rainal | |
| 4,175,821 A | 11/1979 | Hunter | |
| 4,206,963 A | 6/1980 | English et al. | |
| 4,211,466 A | 7/1980 | Reynolds | |
| 4,265,549 A | 5/1981 | Cote | |
| 4,331,370 A | 5/1982 | Andrews et al. | |
| 4,338,717 A | 7/1982 | Damon | |
| 4,382,653 A | 5/1983 | Blanchard | |
| 4,397,516 A | 8/1983 | Koren et al. | |
| 4,457,574 A | 7/1984 | Walters | |
| 4,477,022 A | 10/1984 | Shuey et al. | |
| 4,571,014 A | 2/1986 | Robin et al. | |
| 4,596,432 A | 6/1986 | Tighe, Jr. | |
| 4,686,607 A | 8/1987 | Johnson | |
| 4,689,721 A | 8/1987 | Damerow et al. | |
| 4,697,858 A | 10/1987 | Balakrishnan | |
| 4,705,332 A | 11/1987 | Sadigh-Behzadi | |
| 4,755,765 A | 7/1988 | Ferland | |
| 4,806,107 A | 2/1989 | Arnold et al. | |
| 4,816,791 A | 3/1989 | Carnahan et al. | |
| 4,820,170 A | 4/1989 | Redmond et al. | |
| 4,836,791 A | 6/1989 | Grabbe et al. | |
| 4,846,727 A | 7/1989 | Glover et al. | |
| 4,861,272 A | 8/1989 | Clark | |
| 4,867,707 A | 9/1989 | Widdoes | |
| 4,871,321 A | 10/1989 | Johnson | |
| 4,891,616 A | 1/1990 | Renken et al. | |
| 4,898,539 A | 2/1990 | Glover et al. | |
| 4,900,258 A | 2/1990 | Hnatuck et al. | |
| 4,924,918 A | 5/1990 | Lin et al. | |
| 4,941,831 A | 7/1990 | Tengler et al. | |
| 4,946,392 A | 8/1990 | Kobler et al. | |
| 4,947,144 A | 8/1990 | Le Nohaic | |
| 4,975,084 A | 12/1990 | Fedder et al. | |
| 4,979,903 A | 12/1990 | Gosselin | |
| 4,988,306 A | 1/1991 | Hopfer, III et al. | |
| 5,007,843 A | 4/1991 | Smolley | |
| RE33,611 E | 6/1991 | Michaels et al. | |
| 5,027,088 A | 6/1991 | Shimizu et al. | |
| 5,037,314 A | 8/1991 | Bricaud et al. | |
| 5,046,960 A | 9/1991 | Fedder | |
| 5,055,069 A | 10/1991 | Townsend et al. | |
| 5,066,236 A | 11/1991 | Broeksteeg | |
| 5,083,238 A | 1/1992 | Bousman | |
| 5,104,341 A | 4/1992 | Gilissen et al. | |
| 5,114,355 A | 5/1992 | Kimmel et al. | |
| 5,118,300 A | 6/1992 | Zarreii | |
| 5,119,886 A | 6/1992 | Fletcher et al. | |
| 5,122,064 A | 6/1992 | Zarreii | |
| 5,122,065 A | 6/1992 | Dudek et al. | |
| 5,127,837 A | 7/1992 | Shah et al. | |
| 5,158,471 A | 10/1992 | Fedder et al. | |
| 5,163,834 A | 11/1992 | Chapin et al. | |
| 5,167,531 A | 12/1992 | Broschard, III et al. | |
| 5,169,343 A | 12/1992 | Andrews | |
| 5,174,770 A | 12/1992 | Sasaki et al. | |
| 5,175,928 A | 1/1993 | Grabbe | |
| 5,186,647 A | 2/1993 | Denkmann et al. | |
| 5,197,893 A | 3/1993 | Morlion et al. | |
| 5,215,473 A | 6/1993 | Brunker et al. | |
| 5,226,835 A | 7/1993 | Baker, III et al. | |
| 5,249,974 A | 10/1993 | Wang | |
| 5,259,773 A | 11/1993 | Champion et al. | |
| 5,282,754 A | 2/1994 | Kish et al. | |
| 5,286,212 A | 2/1994 | Broeksteeg | |
| 5,292,256 A | 3/1994 | Brunker et al. | |
| 5,295,867 A | 3/1994 | Bethurum | |
| 5,299,956 A | 4/1994 | Brownell et al. | |
| 5,316,489 A | 5/1994 | Kachlic et al. | |
| 5,334,962 A | 8/1994 | Higgins et al. | |
| 5,340,334 A | 8/1994 | Nguyen | |
| 5,342,211 A | 8/1994 | Broeksteeg | |
| 5,354,219 A | 10/1994 | Wanjura | |
| 5,380,216 A | 1/1995 | Broeksteeg et al. | |
| 5,387,114 A | 2/1995 | Brunker et al. | |
| 5,388,997 A | 2/1995 | Grange et al. | |
| 5,395,249 A | 3/1995 | Reynolds et al. | |
| 5,399,105 A | 3/1995 | Kaufman et al. | |
| 5,401,912 A | 3/1995 | Mattei | |
| 5,404,117 A | 4/1995 | Walz | |
| 5,414,393 A | 5/1995 | Rose et al. | |
| 5,429,520 A | 7/1995 | Morlion et al. | |
| 5,432,484 A | 7/1995 | Klas et al. | |
| 5,433,618 A | 7/1995 | Morlion et al. | |
| 5,443,401 A | 8/1995 | Champion et al. | |
| 5,443,617 A | 8/1995 | Takahashi | |
| 5,454,738 A | 10/1995 | Lim et al. | |
| 5,460,533 A | 10/1995 | Broeksteeg et al. | |
| 5,467,040 A | 11/1995 | Nelson et al. | |
| 5,470,244 A | 11/1995 | Lim et al. | |
| 5,479,321 A | 12/1995 | Mair et al. | |
| 5,483,020 A | 1/1996 | Hardie et al. | |
| 5,484,310 A | 1/1996 | McNamara et al. | |
| 5,490,787 A | 2/1996 | Bowman et al. | |
| 5,495,075 A | 2/1996 | Jonckheere et al. | |
| 5,496,183 A | 3/1996 | Soes et al. | |
| 5,501,613 A | 3/1996 | Lenoir | |
| 5,513,065 A | 4/1996 | Caveney et al. | |
| 5,516,294 A | 5/1996 | Andrews et al. | |
| 5,522,727 A | 6/1996 | Saito et al. | |
| 5,539,360 A | 7/1996 | Vannatta et al. | |
| 5,547,405 A | 8/1996 | Pinney et al. | |
| 5,552,565 A | 9/1996 | Cartier et al. | |
| 5,552,752 A * | 9/1996 | Sturdivant et al. | 333/243 |
| 5,554,038 A | 9/1996 | Morlion et al. | |
| 5,577,935 A | 11/1996 | Harting et al. | |
| 5,586,914 A | 12/1996 | Foster, Jr., et al. | |
| 5,597,313 A | 1/1997 | Lindeman | |
| 5,605,477 A | 2/1997 | Wu et al. | |
| 5,618,205 A | 4/1997 | Riddle et al. | |
| 5,620,340 A | 4/1997 | Andrews | |
| 5,624,268 A | 4/1997 | Maeda et al. | |
| 5,626,497 A | 5/1997 | Bouchan et al. | |
| 5,632,634 A | 5/1997 | Soes | |
| 5,633,615 A | 5/1997 | Quan | |
| 5,647,770 A | 7/1997 | Belopolsky | |
| 5,658,156 A | 8/1997 | Henderson et al. | |
| 5,661,901 A | 9/1997 | King | |
| 5,664,968 A | 9/1997 | Mickievicz | |
| 5,672,062 A | 9/1997 | Lindeman | |
| 5,674,093 A | 10/1997 | Vaden | |
| 5,675,302 A | 10/1997 | Howard et al. | |
| 5,697,817 A | 12/1997 | Bouchan et al. | |
| 5,699,228 A | 12/1997 | Lee | |
| 5,700,167 A | 12/1997 | Pharney et al. | |
| 5,702,258 A | 12/1997 | Provencher et al. | |
| 5,704,794 A | 1/1998 | Lindeman | |
| 5,704,795 A | 1/1998 | Lindeman | |
| 5,716,237 A | 2/1998 | Conorich et al. | |
| 5,743,765 A | 4/1998 | Andrews et al. | |
| 5,788,512 A | 8/1998 | Lindeman et al. | |
| 5,789,994 A | 8/1998 | Case et al. | |
| 5,791,947 A | 8/1998 | Crane, Jr. et al. | |
| 5,795,190 A | 8/1998 | Ono | |
| 5,795,191 A | 8/1998 | Preputnick et al. | |
| 5,816,826 A | 10/1998 | Colemen | |
| 5,823,795 A * | 10/1998 | Schumacher | 439/76.1 |
| 5,828,226 A | 10/1998 | Higgins et al. | |
| 5,834,335 A * | 11/1998 | Buschbom | 438/107 |

| | | |
|---|---|---|
| 5,842,873 A | 12/1998 | Gonzales |
| RE36,065 E | 1/1999 | Andrews et al. |
| 5,886,590 A | 3/1999 | Quan et al. |
| 5,888,096 A | 3/1999 | Soes et al. |
| 5,890,915 A | 4/1999 | Reylek |
| 5,895,276 A | 4/1999 | Rothenberger |
| 5,931,687 A | 8/1999 | McFarlane et al. |
| 5,940,278 A | 8/1999 | Schumacher |
| 5,949,656 A | 9/1999 | Pinault |
| 5,955,889 A | 9/1999 | Taguchi et al. |
| 5,961,355 A | 10/1999 | Morlion et al. |
| 5,967,844 A | 10/1999 | Doutrich et al. |
| 5,967,850 A | 10/1999 | Crane, Jr. |
| 5,967,853 A | 10/1999 | Hashim |
| 5,980,321 A | 11/1999 | Cohen et al. |
| 5,984,710 A | 11/1999 | Kodama |
| 5,993,255 A | 11/1999 | Yurko |
| 5,993,256 A | 11/1999 | Shimojyo |
| 5,993,259 A | 11/1999 | Stokoe et al. |
| 6,010,373 A | 1/2000 | Donahue |
| 6,012,927 A | 1/2000 | Longueville et al. |
| 6,039,580 A | 3/2000 | Sciarretta et al. |
| 6,042,388 A | 3/2000 | Tustaniwskyj et al. |
| 6,042,394 A | 3/2000 | Mitra et al. |
| 6,046,410 A | 4/2000 | Wojnarowski et al. |
| 6,050,842 A | 4/2000 | Ferrill et al. |
| 6,062,870 A | 5/2000 | Hopfer, III et al. |
| 6,083,047 A | 7/2000 | Paagman |
| 6,123,554 A | 9/2000 | Ortega et al. |
| 6,132,244 A | 10/2000 | Leeman et al. |
| 6,146,202 A | 11/2000 | Ramey et al. |
| 6,183,301 B1 | 2/2001 | Paagman |
| 6,220,896 B1 | 4/2001 | Bertoncini et al. |
| 6,231,391 B1 | 5/2001 | Ramey et al. |
| 6,234,807 B1 | 5/2001 | Amini et al. |
| 6,236,287 B1 | 5/2001 | Quan et al. |
| 6,238,245 B1 | 5/2001 | Stokoe et al. |
| 6,247,972 B1 | 6/2001 | Crane, Jr. et al. |
| 6,264,476 B1 | 7/2001 | Li et al. |
| 6,273,753 B1 * | 8/2001 | Ko .............................. 439/579 |
| 6,280,201 B1 * | 8/2001 | Morris ........................ 439/65 |
| 6,293,827 B1 | 9/2001 | Stokoe |
| 6,305,947 B1 | 10/2001 | Bruce |
| 6,307,391 B1 | 10/2001 | Tustaniwskyj et al. |
| 6,316,719 B1 | 11/2001 | Pluymers et al. |
| 6,343,955 B2 | 2/2002 | Billman et al. |
| 6,347,962 B1 | 2/2002 | Kline |
| 6,364,710 B1 | 4/2002 | Billman et al. |
| 6,371,813 B2 | 4/2002 | Ramey et al. |
| 6,379,188 B1 | 4/2002 | Cohen et al. |
| 6,380,485 B1 * | 4/2002 | Beaman et al. ........... 174/88 R |
| 6,435,913 B1 | 8/2002 | Billman |
| 6,439,894 B1 | 8/2002 | Li |
| 6,461,197 B2 | 10/2002 | Crane, Jr. et al. |
| 6,461,202 B2 | 10/2002 | Kline |
| 6,471,548 B2 | 10/2002 | Bertoncini et al. |
| 6,482,038 B2 | 11/2002 | Olson |
| 6,491,545 B1 | 12/2002 | Spiegel et al. |
| 6,503,103 B1 | 1/2003 | Cohen et al. |
| 6,506,076 B2 | 1/2003 | Cohen et al. |
| 6,524,135 B1 | 2/2003 | Feldman et al. |
| 6,527,587 B1 | 3/2003 | Ortega et al. |
| 6,527,588 B2 | 3/2003 | Paagman |
| 6,540,558 B1 | 4/2003 | Paagman |
| 6,551,140 B2 | 4/2003 | Billman et al. |
| 6,554,647 B1 | 4/2003 | Cohen et al. |
| 6,565,387 B2 | 5/2003 | Cohen |
| 6,572,410 B1 | 6/2003 | Volstorf et al. |
| 6,602,095 B2 | 8/2003 | Astbury, Jr. et al. |
| 6,607,402 B2 | 8/2003 | Cohen et al. |
| 6,623,310 B1 | 9/2003 | Billman et al. |
| 6,652,319 B1 | 11/2003 | Billman |
| 6,663,427 B1 | 12/2003 | Billman et al. |
| 6,663,429 B1 | 12/2003 | Korsunsky et al. |
| 6,743,057 B2 | 6/2004 | Davis et al. |
| 2001/0003077 A1 | 6/2001 | Van Woensel |
| 2001/0005654 A1 | 6/2001 | Cohen et al. |
| 2001/0012704 A1 | 8/2001 | Eldridge |
| 2001/0012729 A1 | 8/2001 | Van Woensel |
| 2001/0012730 A1 | 8/2001 | Ramey et al. |
| 2001/0041477 A1 | 11/2001 | Billman et al. |
| 2002/0025721 A1 | 2/2002 | Bertoncini et al. |
| 2002/0049229 A1 | 4/2002 | Pape et al. |
| 2002/0081869 A1 | 6/2002 | Abbott |
| 2002/0094705 A1 | 7/2002 | Driscoll et al. |
| 2002/0102869 A1 | 8/2002 | Ali et al. |
| 2002/0102885 A1 | 8/2002 | Kline |
| 2002/0111068 A1 | 8/2002 | Cohen et al. |
| 2002/0123266 A1 | 9/2002 | Ramey et al. |
| 2002/0127893 A1 | 9/2002 | Brodsky |
| 2002/0137400 A1 | 9/2002 | Billman et al. |
| 2002/0168898 A1 | 11/2002 | Billman et al. |
| 2002/0173175 A1 | 11/2002 | Brodsky et al. |
| 2002/0187663 A1 | 12/2002 | Li |
| 2003/0003803 A1 | 1/2003 | Billman et al. |
| 2003/0143894 A1 | 7/2003 | Kline et al. |
| 2003/0186594 A1 | 10/2003 | Davis et al. |
| 2003/0220019 A1 | 11/2003 | Billman et al. |
| 2003/0220021 A1 | 11/2003 | Whiteman, Jr. et al. |

* cited by examiner

HIGH SPEED, HIGH DENSITY INTERCONNECT SYSTEM FOR DIFFERENTIAL AND SINGLE-ENDED TRANSMISSION APPLICATIONS

RELATED APPLICATION

The present application claims priority of provisional patent application Serial No. 60/260,893 filed Jan. 12, 2001, entitled "HIGH SPEED, HIGH DENSITY INTERCONNECT SYSTEM FOR DIFFERENTIAL AND SINGLE-ENDED TRANSMISSION APPLICATIONS" and provisional patent application Serial No. 60/328,396 filed Oct. 12, 2001, entitled "HIGH SPEED, HIGH DENSITY INTERCONNECT SYSTEM FOR DIFFERENTIAL AND SINGLE-ENDED TRANSMISSION APPLICATIONS", the disclosures of which are hereby incorporated by reference in their entirety into the present specification.

FIELD OF THE INVENTION

The present invention relates generally to electrical connectors, and more particularly, to a high speed, high density interconnect system for differential and single-ended transmission applications. The present invention relates to a latching mechanism for compression mount type electrical connectors. The present invention also relates to a high speed, high density electrical connector having a central twinax or coax portion and conductive spring element contacts on opposite ends of the central twinax or coax portion. The present invention also relates to an apparatus for installing conductive spring elements without the need for sockets at opposite ends of the conductive spring element.

BACKGROUND OF THE INVENTION

Backplane systems are comprised of a complex printed circuit board which is referred to as the backplane or motherboard, and several smaller printed circuit boards which are referred to as daughtercards which plug into the backplane. Each of the daughtercards include a chip which is referred to as a driver/receiver. The driver/receiver sends and receives signals from driver/receivers on other daughtercards. A signal path is formed between the driver/receiver on a first daughtercard and a driver/receiver on a second daughtercard. The signal path includes an electrical connector that connects the first daughtercard to the backplane, the backplane, a second electrical connector that connects the second daughtercard to the backplane, and the second daughtercard having the driver/receiver that receives the carried signal. Various driver/receivers being used today can transmit signals at data rates between 5–10 Gb/sec and greater. The limiting factor (data transfer rate) in the signal path are the electrical connectors which connect each daughtercard to the backplane. A need thus exists in the art for a high speed electrical connector capable of handling the required high speed transfer of data.

Further, the receivers are capable of receiving signals having only 5% of the original signal strength sent by the driver. This reduction in signal strength increases the importance of minimizing cross-talk between signal paths to avoid signal degradation or errors being introduced into digital data streams. With high speed, high density electrical connectors, it is even more important to eliminate or reduce cross-talk. Thus, a need exists in the art for a high speed electrical connector capable of handling high speed signals that reduces cross-talk between signal paths.

There are various types of electrical connectors. One type is a through hole connector which could either be a compliant pin or through hole solder. Backplane systems have typically used connectors which consist of multiple contacts having pins which are inserted into the through hole contained in the printed circuit boards to be connected. The pins can be compliant fit or can be soldered in place. These require a relatively large diameter hole in the printed circuit board for receiving the pins of the connector. The larger the hole the greater the probability of defects from plating and the greater the capacitance which reduces the signal speed which can be accommodated by these connectors. For example, plated through holes may not be properly plated and thus pins being inserted from the electrical connector can cause open shorts, etc. The plated through hole causes a capacitive effect which reduces the data rate which can be transferred through the pin and hole. Further, many contact type connectors are made from stamped parts which have varying geometries which increase signal reflection and reduce signal speed. Thus, it is advantageous to reduce the diameter of plated through hole sizes using a compression mount-type connectors which rely on a spring making contact with a pad on a board.

Many of these problems can be solved using a compression mount type electrical connector. This type of connector overcomes many of the deficiencies of the through hole contact type but compression mount connectors need bulky and expensive hardware to fasten the compression mount connector to the printed circuit board. Intimate contact needs to be maintained between compression mount contacts and the PC board surface without using additional fasteners such as jack screws.

Additionally, regardless of the type of electrical connector, the electrical connector has to be capable of being mated/unmated at least 250 and perhaps in excess of 1000 times. If the contacts wear, then contact resistance will increase. Contact wear can occur through metal to metal contact either through a point or line. For example, a certain area may continually get wiped as the connector is mated/unmated and the contact tends to wear through the metal sliding action can also cause wear. Also, some compression mount type connectors use dendrite contacts on flexible circuits. One difficulty with dendrite contacts is that these contacts tend to wear and are only good for a half a dozen mating cycles and the dendrites start to flatten out and the multiple points of contacts are lost thereby reducing reliability. Thus, a need exists for a compression mount-type connector that eliminates or reduces contact wear.

Another problem with prior art electrical connectors is that impedance changes over the length of the signal path reduce the potential signal speed. A need exists for an electrical connector in which impedance can be controlled at a specific value and where the specific value remains relatively constant over the length of the signal path.

In summary, electrical connectors used to electrically connect circuit boards such as backpanels to daughtercards suffer from several deficiencies including poor shielding resulting in electrical noise, changes in impedance and the inability to connect and disconnect many times without damage to the electrical connector. These deficiencies limit the data rate that can be transferred through the connector. Thus, a need exists in the art for a high density electrical connector which overcomes the aforementioned problems to a large extent.

SUMMARY OF THE INVENTION

It is an object of the present invention to provide an electrical interconnect system capable of carrying signals at data rates between 5–10 Gb/sec or more.

It is another object of the present invention to provide a compression mount type connector having a simple and elegant latching mechanism for keeping the electrical connector in contact with each PC board.

Still another object of the present invention is to provide an electrical connector having a differential pair having constant impedance over the signal path and capable of carrying signals at between 5–10 Gb/sec or more.

Yet another of the present invention is to provide a coaxial cable connector having constant impedance over the signal path and capable of carrying signals at data rates between 5–10 Gb/sec or more.

Another object of the present invention is to provide an electrical connector in which cross-talk between signal paths of adjacent twinax cables or adjacent coaxial cables within the electrical connector is reduced and/or eliminated.

Yet another object of the present invention is to provide a compression type electrical connector using conductive spring elements or some other conductive spring configuration.

Still another object of the present invention is to provide a means of protecting conductive spring elements when the electrical connector is not connected.

The present invention is directed to a high density electrical connector which can provide 80 or more twinax connections per linear inch in a 20 millimeter card slot. In a typical electronic system package, 20 millimeters is the spacing from center line to center line of the adjacent parallel daughtercards. Twinax cable is coaxial cable that contains two inner conducting wires rather than one. The two inner conducting wires provide two physical channels. Coaxial cable is called "coaxial" because it includes one physical channel that carries the signal surrounded (after a layer of insulation) by another concentric physical channel, both running along the same axis. The outer channel serves as ground.

In a first embodiment, the electrical connector according to the present invention utilizes conductive spring elements positioned in a daughtercard interposer and a backpanel interposer electrically to connect the two inner signal carrying conductor wires to conductive pads on a printed circuit board. Shielding members of the conductive spring elements are used to surround stripped (unshielded) sections of twinax cable and to electrically connect the outer jacket to ground planes in the daughtercard and the backpanel and to provide shielding between the closely spaced conductors. Advantageously, the present invention permits the impedance of the connector to be controlled by changing the dielectric thickness and constants.

These and other objects of the present invention are achieved by an interconnect system. including a first interposer housing including a first plurality of shielding members providing shielding for the thickness of the first interposer. A second interposer housing includes a second plurality of shielding members providing shielding for the thickness of the second interposer. At least one cable has a central conductor, a conductive outer jacket, and a dielectric separating the central conductor and the conductive outer jacket. The outer jacket is in electrical contact with at least some of the plurality of shielding members in the first interposer housing and the second interposer housing. A cable housing is connected to the first interposer and to the interposer for retaining the at least one cable. The at least one cable has exposed portions extending beyond the cable housing into the first interposer and the second interposer, respectively. At least one conductive spring element is in contact with a central conductor of the at least one cable.

The foregoing and other objects of the present invention are achieved by an electrical connector, including a central cable surrounded by a dielectric layer and an electrically conductive jacket. The central cable has exposed opposite ends. A first plurality of shielding members are in electrical contact with one end of the electrically conductive jacket. A second plurality of shielding members are in electrical contact with an opposite end of the electrically conductive jacket. A first conductive spring element is in contact with one of the exposed opposite ends of the central cable. A second conductive spring element is in contact with an opposite exposed end of central cable.

The foregoing and other objects of the present invention are achieved by a twinax electrical connector, including a twinax cable having two electrical conductors spaced from each other and having a dielectric surrounding the two electrical conductors and an electrically conductive layer surrounding the dielectric. The two electrical conductors each have exposed opposite ends. A first plurality of shielding members are in electrical contact with one end of the electrically conductive jacket. A second plurality of shielding members are in electrical contact with an opposite end of the electrically conductive jacket. A first set of conductive spring elements are each in contact with a corresponding one exposed end of the two electrical conductors. A second set of conductive spring elements are each in contact with a corresponding second exposed end of the two electrical conductors.

The foregoing and other objects of the present invention are achieved by a method of transmitting a differential signal using an electrically shielded twinax cable includes carrying a first signal and a second signal each on a separate conductor of the twinax cable and shielding the separate conductors from adjacent conductors without shielding the separate conductors from each other and measuring the difference at a receiver between the first and second signal to arrive at an actual signal pulse.

The foregoing and other objects of the present invention are achieved by a matching mechanism for a compression mount connector. The compression mount connected is mountable to a printed circuit board. A guide pin is mounted to the printed circuit board. The guide pin has a groove thereabout. A guide block has a biased latching device for engaging the groove when the guide pin groove is brought into engagement therewith. The electrical connector has contacts which exert a force in a direction away from the electrical connector being in a mated condition with contacts on the circuit board and the latching mechanism is capable of resisting the force such that the contacts in the electrical connector remain in contact with the contacts on the circuit board.

The foregoing and other objects of the present invention are achieved by an electrical connector having a plurality of twinax cables arranged in a vertical and horizontal array. A first set of twinax cables are arranged in a vertical array and spaced from each other. Each twinax cable has a pair of conductors, a dielectric layer and an electrically conductive jacket. A second set of twinax cables are arranged in a vertical array and spaced from each other and horizontally spaced from the first set of twinax cables. A first plurality of conductive spring elements are each positioned against a corresponding conductor. A second plurality of conductive spring elements are each positioned against a corresponding conductor. A cable housing retains the first set and the second set of twinax cables. A first interposer is on one side of the cable housing for receiving one end of the first set and the second set of twinax cables. A second interposer is on another side of the cable housing for receiving an opposite end of the first set and the second set of twinax cables. A first retaining sheet retains signal spring contacts in contact with each pair of conductors on the one end of the first and second set of twinax cables. A second retaining sheet retains signal spring contacts in contact with each pair of conductors on the opposite end of the first and second set of twinax cables. A first interposer slide is biased in a direction away from the first interposer and receives an opposite end of the signal conductors and has a retracted position and a normal extended position. A second interposer slide is biased in a direction away from the second interposer and receives an opposite end of the signal conductors and has a retracted position and an extended position. The conductive spring elements are retained by the first retaining sheet and the second retaining sheet and are protected by the first interposer slide and the second interposer slide, respectively, when each is in the retracted position. The first plurality and the second plurality of conductive spring elements extend beyond the first interposer slide and the second interposer slide, respectively, when each is in the normal extended position.

The foregoing and other objects of the present invention are achieved by an electrical interconnect system, including at least one cable having at least one central conductor and a conductive outer jacket with an insulator therebetween. A set of cable housings retains at least one cable. A first interposer cable housing has a first plurality of through holes corresponding to the at least one central conductor and a second plurality of holes partially overlapped in a radial direction with a respective one of the conductive outer jackets. A second interposer cable housing has a third plurality of through holes corresponding to the at least one central conductor and a fourth plurality of holes partially overlapped in a radial direction with a respective one of the conductive outer jackets. A first plurality of electrically conductive spring elements is inserted into the first plurality of through holes in the first interposer. A second plurality of electrically conductive spring elements is inserted into the second plurality of holes in the first interposer. A first interposer slide includes a first interposer cable housing having a first plurality of through holes corresponding to the at least one central conductor. A second plurality of holes is partially overlapped in a radial direction with a respective one of the conductive outer jackets. A first retainer positioned between the first interposer cable housing and the first interposer slide retains the first plurality of electrically conductive spring elements and the second plurality of electrical conductive spring elements. A second interposer cable housing has a third plurality of through holes corresponding to the at least one central conductor. A fourth plurality of holes is partially overlapped in a radial direction with a respective one of the conductive outer jackets. A third plurality of electrically conductive spring elements is inserted into the third plurality of through holes in the second interposer. A fourth plurality of electrically conductive spring elements is inserted into the fourth plurality of holes in the second interposer. A second interposer slide includes a third interposer cable housing having a third plurality of through holes corresponding to the at least one central conductor. A fourth plurality of holes is partially overlapped in a radial direction with a respective one of the conductive outer jackets.

The foregoing and other objects of the present invention are achieved by a latching mechanism for a compression mount type connector, including a garter spring retained in the compression mount type connector. A guide pin extends from a circuit board and has an annular inwardly extending groove for receiving an inner diameter of the garter spring.

The foregoing and other objects of the present invention are achieved by a compression mount electrical connector for mounting to a printed circuit board having a guide pin and including a housing with a plurality of signal paths. A latching mechanism includes a latching device in the housing for latching onto the guide pin.

The foregoing and other objects of the present invention are achieved by a twinax electrical connector including a latching device. A twinax cable has two electrical conductors spaced from each other and has a dielectric surrounding the two electrical conductors and an electrically conductive layer surrounding the dielectric. The two electrical conductors has exposed opposite ends. A first plurality of shielding members is in electrical contact with one end of the electrically conductive jacket. A second plurality of shielding members is in electrical contact with an opposite end of the electrically conductive jacket. A first set of conductive spring elements is in contact with a corresponding one exposed end of the two electrical conductors. A second set of conductive spring elements is in contact with a corresponding one exposed end of the two electrical conductors. A second set of conductive spring elements is in contact with a corresponding second exposed end of the two electrical conductors. A latching mechanism includes a latching device in the housing for latching onto the guide pin.

The foregoing and other objects of the present invention are achieved by an electrical connector having a plurality of twinax cables arranged in a vertical and horizontal array and having a latching mechanism. A first set of twinax cables is arranged in a vertical array and spaced from each other. Each twinax cable has a pair of conductors, a dielectric layer and an electrically conductive jacket. A second set of twinax cables is arranged in a vertical array and spaced from each other and horizontally spaced from the first set of twinax cables. A first plurality of conductive spring elements is each positioned against a corresponding conductor. A second plurality of conductive spring elements is each positioned against a corresponding conductor. A cable housing is retained in the first set and the second set of twinax cables. A first interposer on one side of the cable housing is for receiving one end of the first set and the second set of twinax cables. A second interposer on another side of the cable housing is for receiving an opposite end of the first set and the second set of twinax cables. A first retaining sheet is for retaining signal spring contacts in contact with each pair of conductors on the one end of the first and second set of twinax cables. A second retaining sheet is for retaining signal spring contacts in contact with each pair of conductors on the opposite end of the first and second set of twinax cables. A first interposer slide is biased in a direction away from the first interposer and receives an opposite end of the signal conductors and has a retracted position and a normal extended position. A second interposer slide is biased in a direction away from the second interposer and receives an opposite end of the signal conductors and has a retracted position and an extended position. The conductive spring elements are retained by the first retaining sheet and the second retaining sheet and are protected by the first interposer slide and the second interposer slide, respectively, when each is in the retracted position. The first plurality and the second plurality of conductive spring elements extend beyond the first interposer slide and the second interposer slide, respectively, when each is in the normal extended position. A latching mechanism includes a latching device in the housing for latching onto the guide pin.

Advantageously, the present invention utilizes printed circuit board space more efficiently than traditional press fit connectors and provides improved shielding for the signal carrying central conductors.

The present invention is also directed to a packaging system for retaining conductive spring elements which are used as either ground contacts or signal contacts in the high density electrical connector.

The present invention also is directed to a means of protecting conductive spring elements when not in contact with a conductive trace on a printed circuit board and/or when the electrical connector is not connected to a printed circuit board.

The present invention can also be used to protect conductive spring elements. As can be appreciated, the conductive spring elements or the wadded wire cylinders are easily damaged if exposed. To protect the conductive spring elements, sockets have been used at opposite ends of the conductive spring elements and/or precise drilled holes to retain the conductive spring elements.

The sockets protect opposite ends of the conductive spring elements which are installed in through bores. The conductive spring element is placed in the throughbore and the movable sockets or top hats are positioned at opposite ends of the throughbore and are spring loaded by the conductive, spring elements to extend beyond the throughbore. Thus, the conductive spring elements are completely surrounded and are protected.

For example, cylindrical button contacts of wadded fine conductor wires have been inserted axially into generally uniform cylindrical holes which were formed in the substrate such as by acid etching of ceramicized glass substrates or drilling a laminated or sheet plastic insulator sheet. The button wads fill the respective holes and are held in place in their corresponding holes by compressive radial frictional engagement with the side walls of each of the holes. Because of this relationship, insertion of the button wads into their respective holes has been a difficult process.

Still other advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

The interconnect arrangement according to the present invention provides a unique twin axial shielded coax structure that has constant impedance from daughtercard interface to the backplane interface. The coaxial structure provides for constant impedance of 65 ohms single ended impedance, 50 ohms odd mode impedance and 100 ohms differential impedance. Advantageously, the present invention provides a controlled impedance connector through the ability to change the characteristic impedance of the electrical connector by changing the dielectric thickness and constant. This allows custom connectors to be made at different impedance values ranging from 35 ohms to 150 ohms or higher.

A single ended interconnect path utilizes one conductor to transfer data. A differential interconnect path utilizes two conductors to transmit the same data. The benefit of a differential interconnect path relative to a single ended interconnect path is that transmission speed increases and noise immunity and electromagnetic interference (EMI) concerns are reduced.

Utilizing the twinax design according to the present invention, the connector design described herein will provide the best known practice for transmitting differential data utilizing copper conductors. The same is true for the single ended version. The single ended design utilizes a coaxial conductor to transmit data. This makes it possible to transmit analog (RF) or digital data with signal degradation comparable to that of a coaxial cable.

Figure 1A:
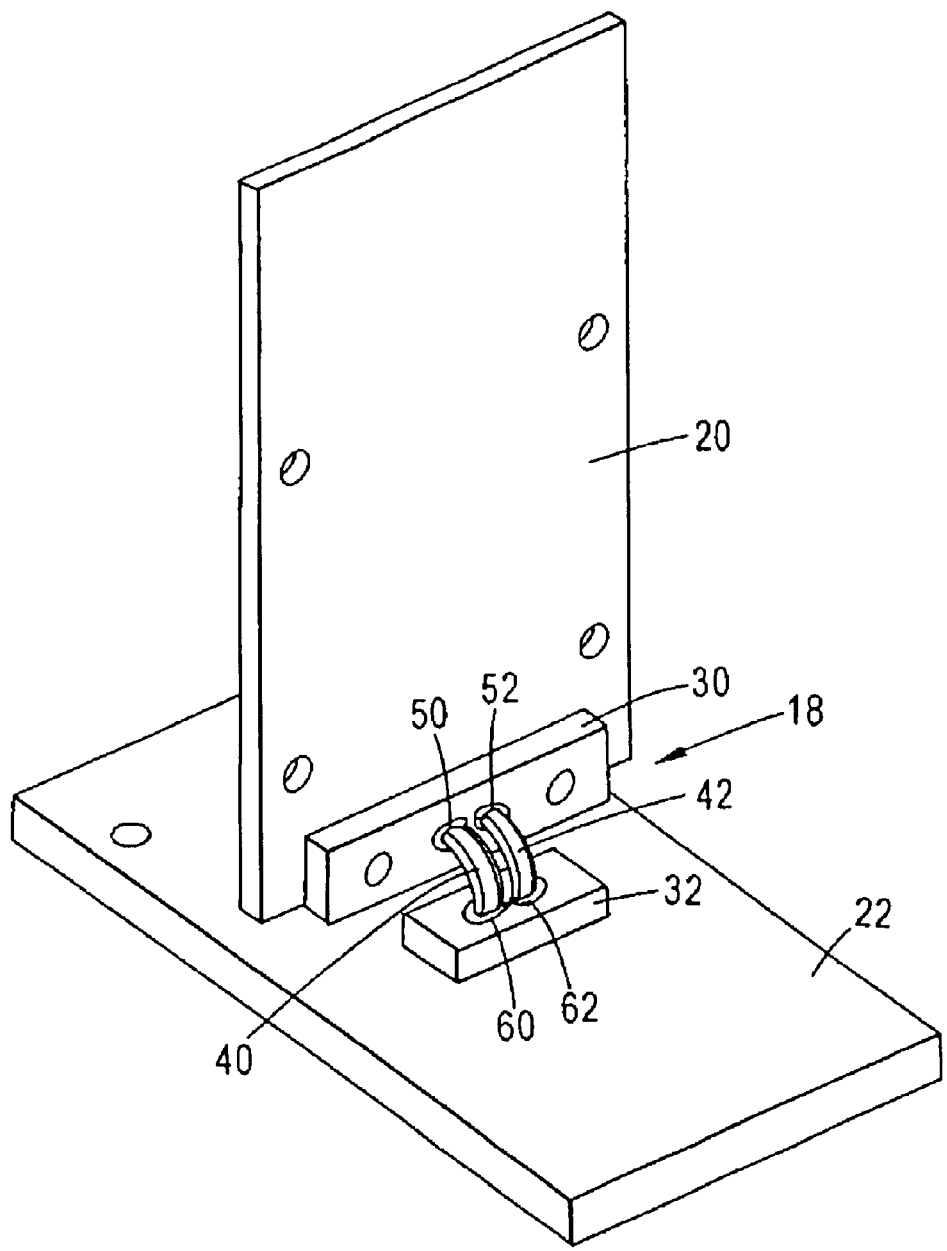
FIG. 1A is a perspective view of an electrical connector according to the present invention mounted to a daughtercard and a backplane with an over-mold omitted for clarity.
Figure 1B:
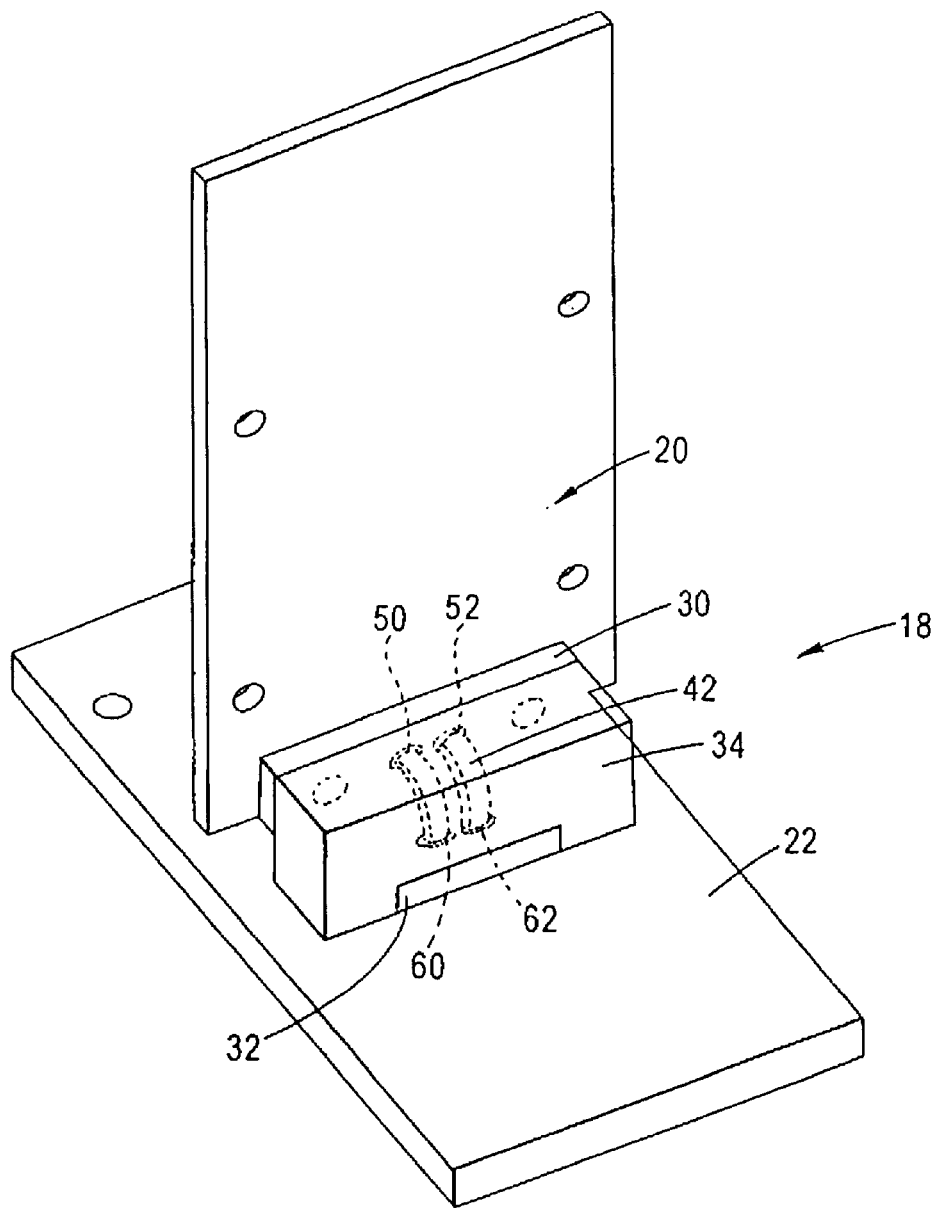
FIG. 1B is the same view as FIG. 1A with the over-mold depicted.

Refer first to FIGS. 1A and 1B where an interconnect system for a high speed, high density interconnect path is illustrated. FIG. 1A shows the electrical connector with the over-mold omitted for simplicity of explanation. The connector 18 is used to electrically connect daughtercard 20 to a backpanel 22. The connector 18 includes, as depicted in FIG. 1B, a daughtercard interposer 30, a backpanel interposer 32, an over-mold 34 which over-molds semi-rigid twinax or coax cables. The over-mold 34 is preferably injection molded, for example, from PBT (polybutylene terephthalate). As depicted in FIGS. 1A and 1B, only two twinax cables 40, 42 are shown for ease of illustration, although it is anticipated that 80 pairs or more of twinax would be used in the electrical connector according to the present invention. The presently preferred embodiment uses twinax cable which is bent into a desired shape. The present invention also contemplates the use of a more rigid construction which is molded in a single piece. For the cables 40, 42 the center conductor is copper, the dielectric material is preferably Teflon™ and the outside jacket is a braid. Preferably, the differential impedance between center conductors is approximately 100 ohms. Using standard formulas, the impedance can easily be adjusted by varying the distance between center conductors and the dielectric constant for example. In FIG. 1A, the over-mold 34 is omitted for clarity. As depicted in FIGS. 1A and 1B, fuzz button arrangements 50, 52, 60, 62 are positioned within the interposers 30, 32, respectively, and surround ends of the twinax cables 40, 42 in order to shield the twinax cables and control the impedance of the connector.

Fuzz buttons and the uses thereof are explained in U.S. Pat. No. 4,988,306, issued Jan. 29, 1991, entitled "LOW-LOSS ELECTRICAL INTERCONNECTS", U.S. Pat. No. 5,886,590, issued Mar. 23, 1999, entitled "MICROSTRIP TO COAX VERTICAL LAUNCHER USING FUZZ BUTTON AND SOLDERLESS INTERCONNECTS", U.S. Pat. No. 6,039,580, issued Mar. 21, 2000, entitled "RF CONNECTOR HAVING A COMPLIANT CONTACT", U.S. Pat. No. 4,924,918, issued May 15, 1990, entitled "MACHINE FOR MANUFCTURING BUTTON CONNECTOR AND METHOD THEREFOR", and U.S. Pat. No. 5,007,843, issued Apr. 16, 1991, entitled "HIGH-DENSITY CONTACT AREA ELECTRICAL CONNECTORS", all of which are hereby incorporated by reference in their entirety into the present specification. Although the present invention described herein is described with respect to conductive spring elements, it should be understood that fuzz buttons are an illustrative type of conductive spring element or contact and that other types of electrically conductive spring elements or springs can be used with the present invention. The conductive spring element provides high reliability, multiple points of contact and is randomly compressed into a shape that provides multiple electrical contact points to a mating surface.

The conductive spring element may take various suitable forms. As one example, the conductive spring element includes a "watch band" or POGO" pin, comprising at least one spring-loaded pin capable of being compressed. In a further alternative, the conductive spring element includes a bellows device comprising a plurality of deformable folds which are compressible. A further suitable conductive spring element includes a Fuzz Button™ which comprises a conductor formed into a plug-shaped compressible mesh. Alternatively, the conductive spring element may include belleville washers or an element comprised of an elastomer loaded with conductive particles. Preferably, the conductive spring element is plated with gold in order to ensure low, stable RF losses in benign or adverse environments.

The conductive spring element may comprise a single element of one of the above-described, or other types suitable for providing at lest one compliant end or, alternatively, may comprise more than one element, in which case at least one of the elements has at lest one compliant end.

Although the present invention is illustrated with respect to a right angle connector 18, it should be understood that the present invention is equally usable in other configurations, for example, such as straight configurations between parallel circuit boards. Also, although the use of the present invention is discussed with respect to daughtercards and backpanels, this is only done for convenience and it should be understood that the electrical connector according to the present invention is usable for connecting all types of circuit boards as well as in other high speed applications.

As illustrated in FIGS. 1A and 1B, the connector 18 would be assembled by connecting interposer 30 and the backpanel interposer 32. As depicted in FIG. 1B, the connector 18 is assembled as follows. First, the twinax cables 40, 42 are formed. All of the conductive spring elements are installed into interposers 30, 32. The twinax cables 40, 42 are then installed into the interposers 30, 32. The assembly is then insert molded to form the over-mold 34 which makes the entire electrical connector 18 rigid. The over-mold 34 is preferably PBT. The electrical connector 18 could then be connected to the daughtercard 20 using fasteners such as screws, rivets, compression posts, and the like.

The conductive spring elements 50, 52, 60, 62 can be made from a single gold plated fine wire that is compressed into a very small shape. The resulting object is a wire mass having spring performance and demonstrates superior electrical signal conduction from high current DC to microwave frequencies. The typical size of a conductive spring element is 0.01 inch in diameter by 0.060 in length. The signal carrying conductive spring elements preferably have the same outer diameter as the signal carrying center cable. The ground contact conductive spring elements do not have to be the same diameter or length as the signal carrying conductive spring elements. The conductive spring elements 50, 52, 60, 62 are employed in the illustrative embodiments, preferably each formed from a strand of metal wire, each strand being wadded together to form a desired cylindrically shaped "button" of material having a density of between 20% and 30%. As depicted in FIGS. 1A and 1B, each wadded-wire connected conductive spring element fits snuggly in openings of the daughtercard interposer 30 and the backpanel interposer 32. The wadded-wire conductive spring elements 50, 52, 60, 62 make electrical contact at multiple points when compressed against the contact area. Connectors of this type have significant advantages over other types of connectors and provide connections of high integrity and reliability. In contrast to other types of connections, this mechanical connector element has very few associated variables that can affect the quality of the connection. The only significant variables are the size of the connector element and the compressive force used to make the connection, both of which can be accurately controlled by controlling the volume into which the conductive spring element is placed. Alternatively, in high vibration environments, the conductive spring elements can be epoxied in place using a conductive epoxy.

The conductive spring elements employed in the illustrative embodiments can be fabricated using nickel wire, or wire made from alloys such as beryllium and copper, silver and copper, or phosphorous and bronze. The compression of the wadded wire of conductive spring elements is substantially elastic so that, when the compressive force of the twinax cables is removed, the conductive spring elements return to their original shape. The wire is randomly compressed into a cylindrical shape and the wire has some spring constant associated with it to provide resiliency when pressure is applied. Advantageously, this allows the electrical connector 18 according to the present invention to be connected and disconnected as many times as is needed. In the embodiments described the wadded-wire conductive spring elements 50, 52, 60, 62 can be manufactured by Technical Wire Products, Inc. of Piscataway, N.J., under the trademark Fuzz Button™.

Figure 2:
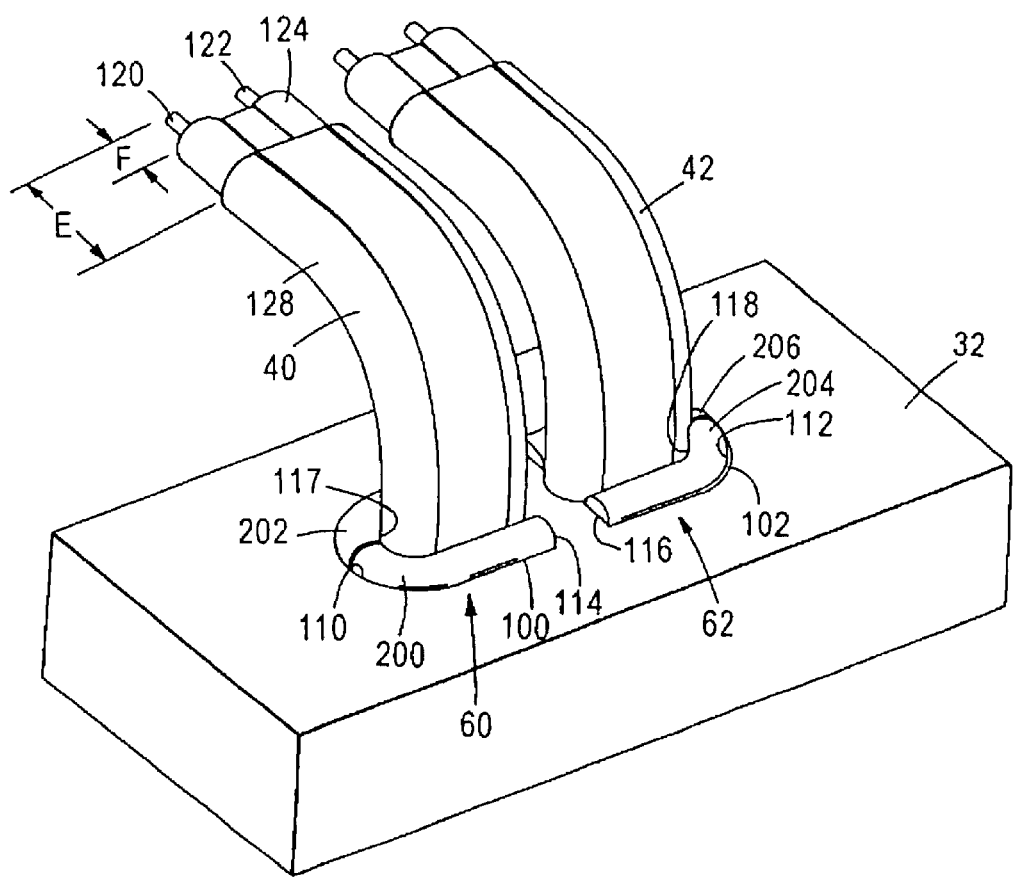
FIG. 2 is a perspective view of the electrical connector according to the present invention with the semi-rigid twinax connected to the back panel interposer only and with the backpanel and over-mold omitted for clarity.

Referring now to FIG. 2, the twinax cables 40, 42 are inserted into the backpanel interposer 32. FIG. 2 differs from FIG. 1 in that two twinax cables 40, 42 are depicted instead of one. It is important to note that central conductors 120, 122 are not shielded from each other. However, it is important to shield twinax pairs from each other as depicted in FIG. 2.

As depicted in FIG. 2, the backpanel interposer 32 has two opposed U-shaped openings 100, 102 each having an outer U-shaped peripheral wall 110, 112, respectively, an inner U-shaped peripheral wall 117, 118 and a straight wall 114, 116, respectively. Walls 114 and 116 face each other as depicted in FIG. 2. Inserted into the U-shaped openings are a plurality of conductive spring elements 200, 202, 204, 206, respectively, each being in a half U-shape as depicted in FIG. 2. For example, conductive spring elements 200, 202 each have a half U-shape and when placed together form a U partially surrounding the twinax cable 40. It should be understood that other shielding methods could be used to replace the conductive spring elements.

The twinax cable 40 has two central conductors 120, 122 surrounded by a Teflon™ sheathing 124. Preferably, signal carrying conductive spring elements 300–306 (see FIG. 3) have the same outer diameters as the two central conductors 120, 122. The Teflon™ sheathing 124 in turn is surrounded by an electrically conductive copper layer which forms a rigid or semi-rigid outer case 128 made of copper and aluminum or a tin filled braiding. Case 128 may be applied using a plating process. As depicted in FIG. 2, the rigid outer case 128 is stripped away to a length E, thereby exposing the Teflon™ sheathing 124. The Teflon™ sheathing 124 is stripped away from the central conductor to a length F. This stripping is done symmetrically on both ends of twinax cables 40, 42. The conductive spring elements 200, 202, 204, 206 are in electrical contact with the layer 128 SO as to form a shield.

Figure 3:
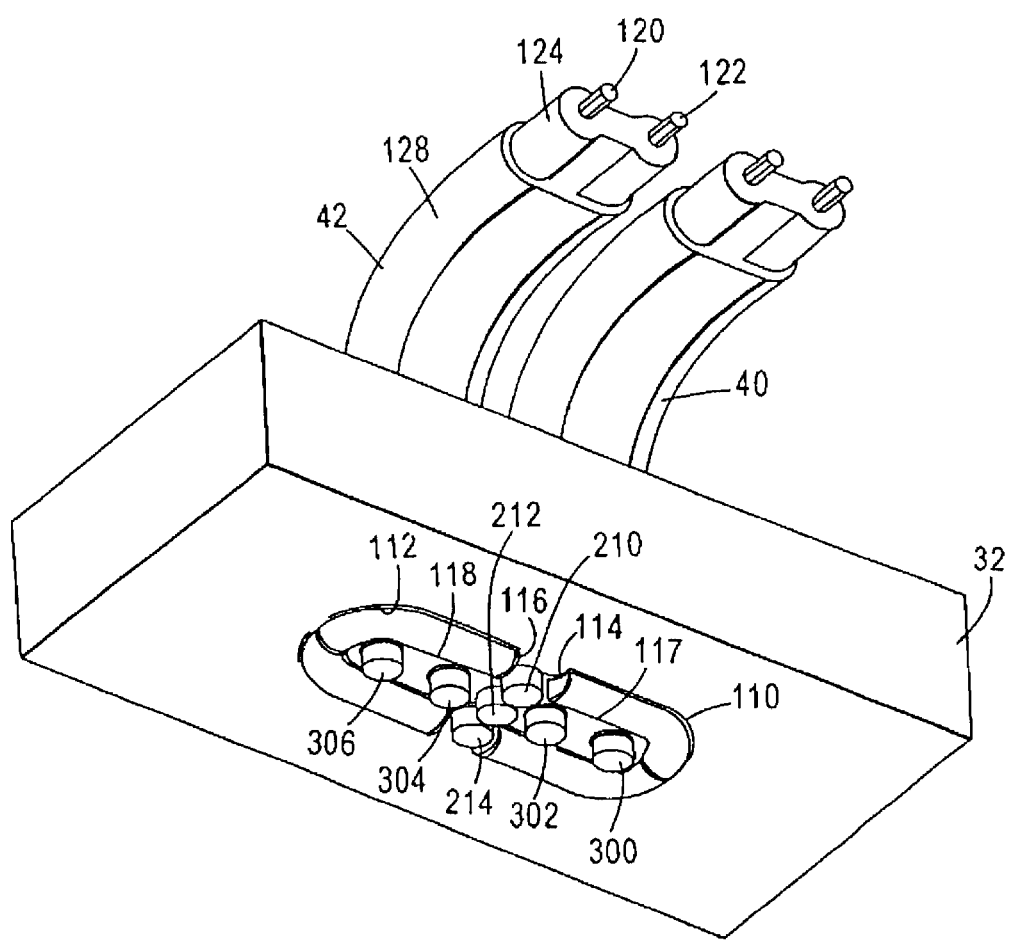
FIG. 3 is a bottom perspective view of FIG. 2.

Refer now to FIG. 3 which depicts a bottom view of FIG. 2. Mounted within the interposer 32 are conductive spring elements stacked one upon another in a half U-configuration through the thickness of interposer 32 for surrounding and shielding the central twinax leads 120, 122, respectively, of twinax cables 40, 42. Also depicted are a plurality of vertically extending cylindrical conductive spring elements 210, 212, 214 which are positioned between walls 114, 116. The conductive spring elements 210, 214 extend through the thickness of interposer 32 and are used to shield twinax cables 40, 42 from each other. As depicted in FIG. 3, it should be understood that there is a full 360° shielding for twinax cables 40, 42 for the stripped away portions of coax cables 40, 42 which extend through the interposer 32. As depicted in FIG. 3, there are four conductive spring elements 300, 302, 304, 306 are in contact with the exposed portions of central conductors 120, 122 of twinax cables 40, 42.

Figure 4:
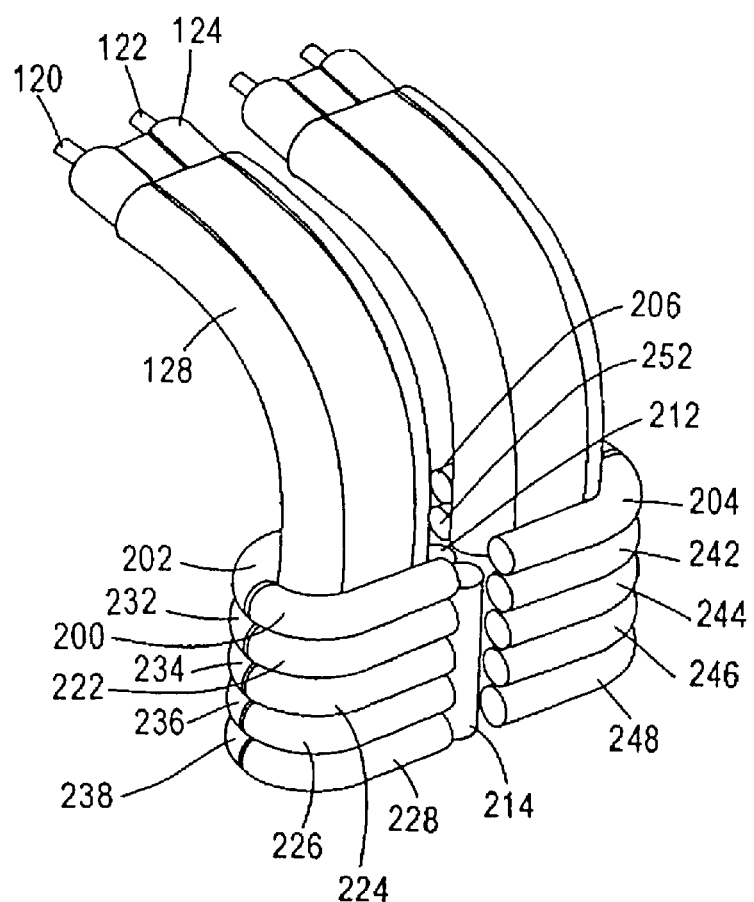
FIG. 4 is the same view as FIG. 2 with the back panel interposer omitted for clarity.

FIG. 4 is an illustration similar to FIGS. 2 and 3 in which the daughtercard interposer 32 has been omitted for clarity. As is evident in FIG. 4, there are four stacks of half U-shaped conductive spring elements 200, 222, 224, 226, 228; 202, 232, 234, 236, 238; and 204, 242, 244, 246, 248, 206, 252, 254, 256, 258 (not shown). These four stacks together with the vertically extending conductive spring elements form a full 360° shield around twinax cables 40, 42. It is envisioned that the uppermost and lowermost conductive spring elements will be used in the present invention. However, it is possible to use structures other than conductive spring elements to electrically connect the uppermost and the lowermost conductive spring elements. For example, a stamped and formed metal component (not shown) can be used to electrically connect the uppermost and the lowermost conductive spring elements.

Figure 5:
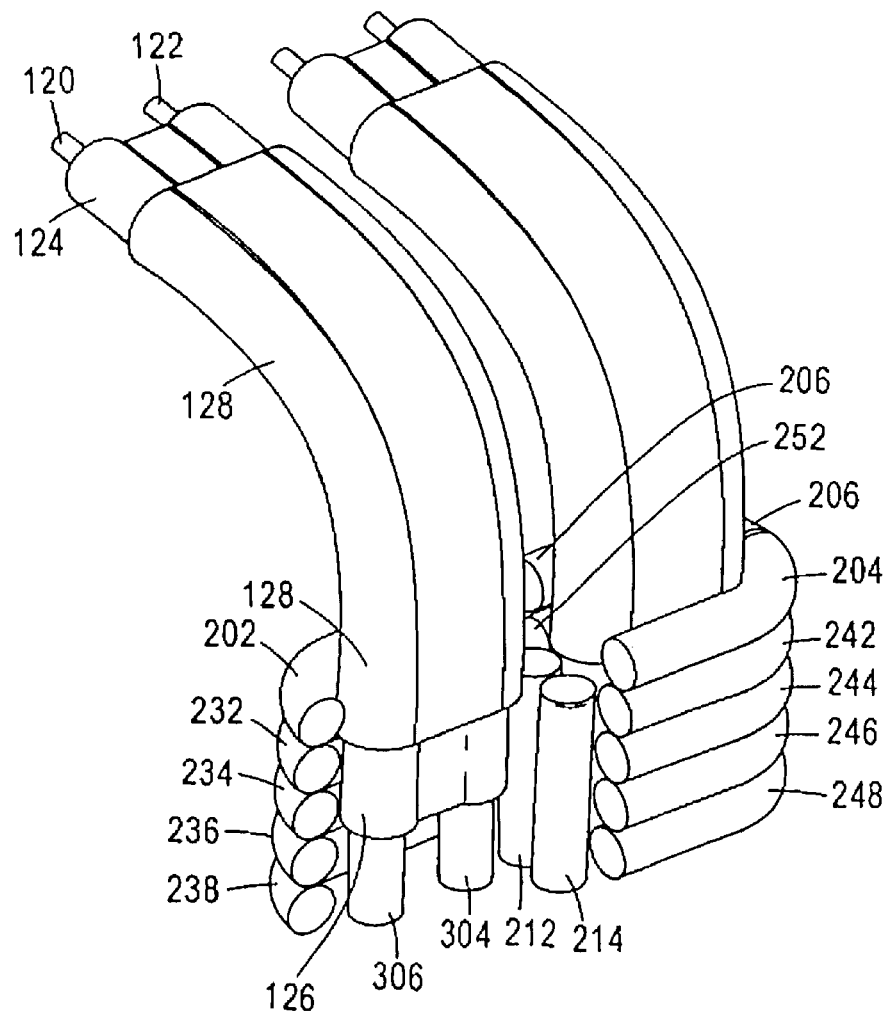
FIG. 5 is the same view as FIG. 4 with some of the conductive spring elements omitted for clarity.

Refer now to FIG. 5 which is similar to FIG. 4 except that conductive spring elements 200, 222, 224, 226 and 228 have been omitted to show conductive spring elements 306, 304 in contact with central conductors 122, 120, respectively.

Figure 6:
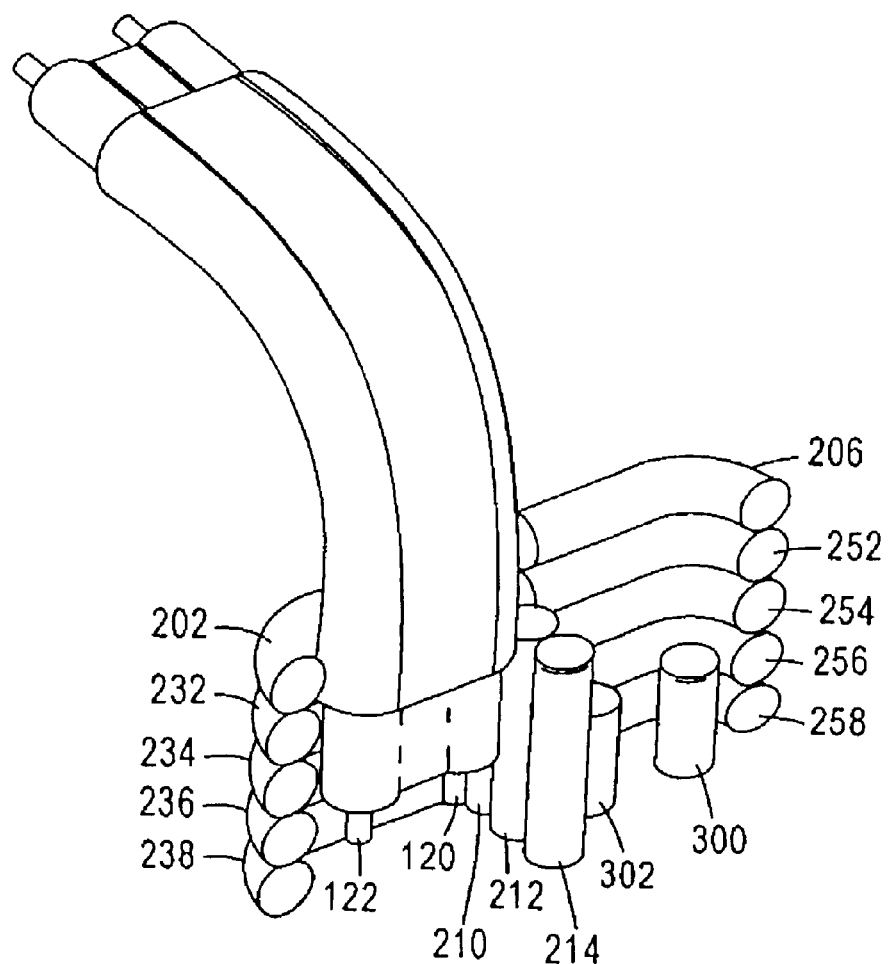
FIG. 6 is the same view as FIG. 5 with additional conductive spring elements omitted for clarity.

As depicted in FIG. 6, it can be seen that conductive spring elements 300, 302 and also 304, 306 (not shown) contact the exposed portions of the central signal carriers 120, 122. These conductive spring elements 300–306 are the signal carrying conductive spring elements. It is important that the signal carrying conductive spring elements are substantially the same diameter as the twinax central conductors 120, 122 to maintain constant impedance. It is also envisioned that other types of spring contacts could be used in the present invention. For example, conductive textiles may be used. Compression springs could also be used. The conductive textile may be injected into the connector replacing the conductive spring elements.

Figure 7:
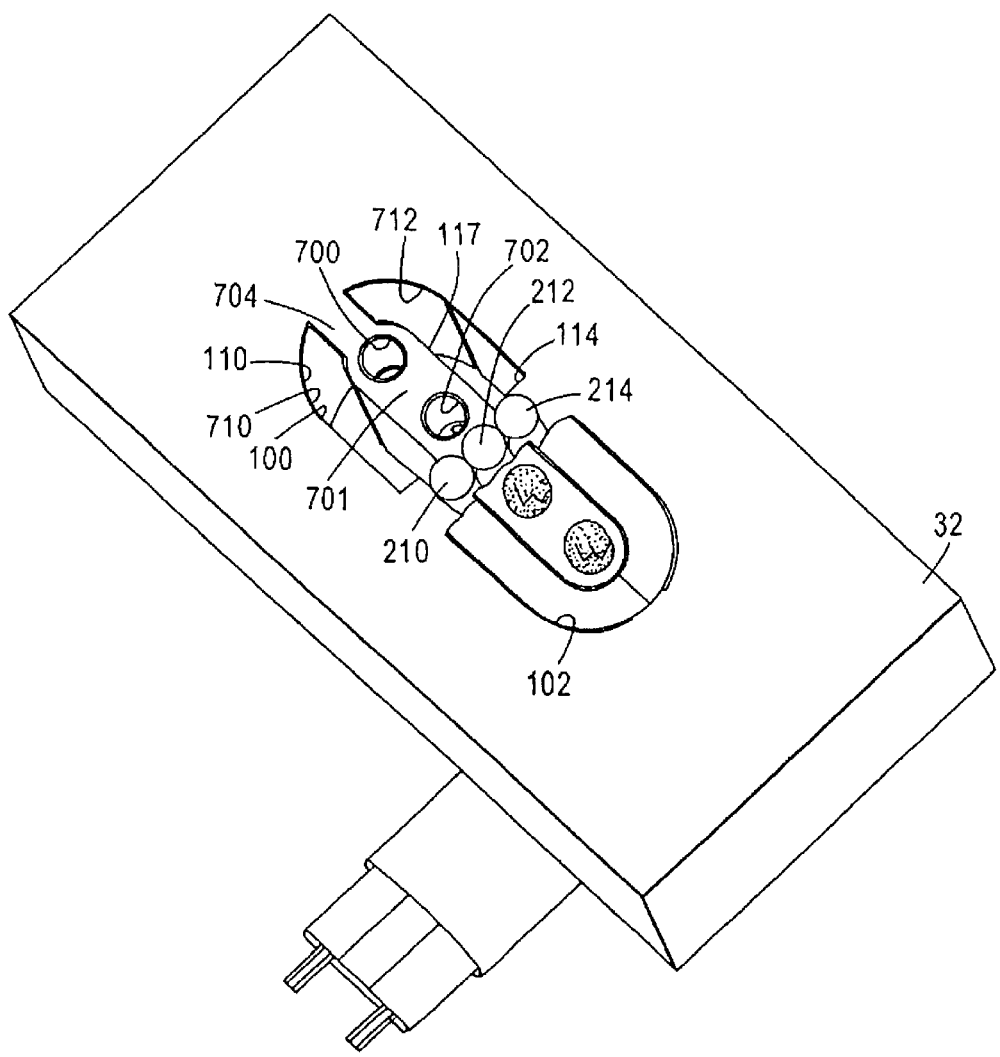
FIG. 7 is a bottom perspective view with the conductive spring elements omitted for clarity.

Refer now to FIG. 7 where a bottom perspective view of the electrical connector 18 is depicted. As depicted in FIG. 7, a central portion 701 is formed between the straight wall 114 and the bottom of the outer U-shape wall 110. The central portion 701 includes through holes 700 and 702 which receive vertically extending conductive spring elements 300, 302. A wall 704 is formed centrally in the U-shaped area to form a first half U-shaped opening 710 and a second U-shaped opening 712 which receive conductive spring elements 206, 252, 254, 256, 258 and 204, 242, 244, 246, 248, respectively. It is envisioned that there could be a two piece construction and the center support structure could be a separate member constructed of a Teflon™ dielectric. Also, metal plated plastic components could be used.

Figure 8:
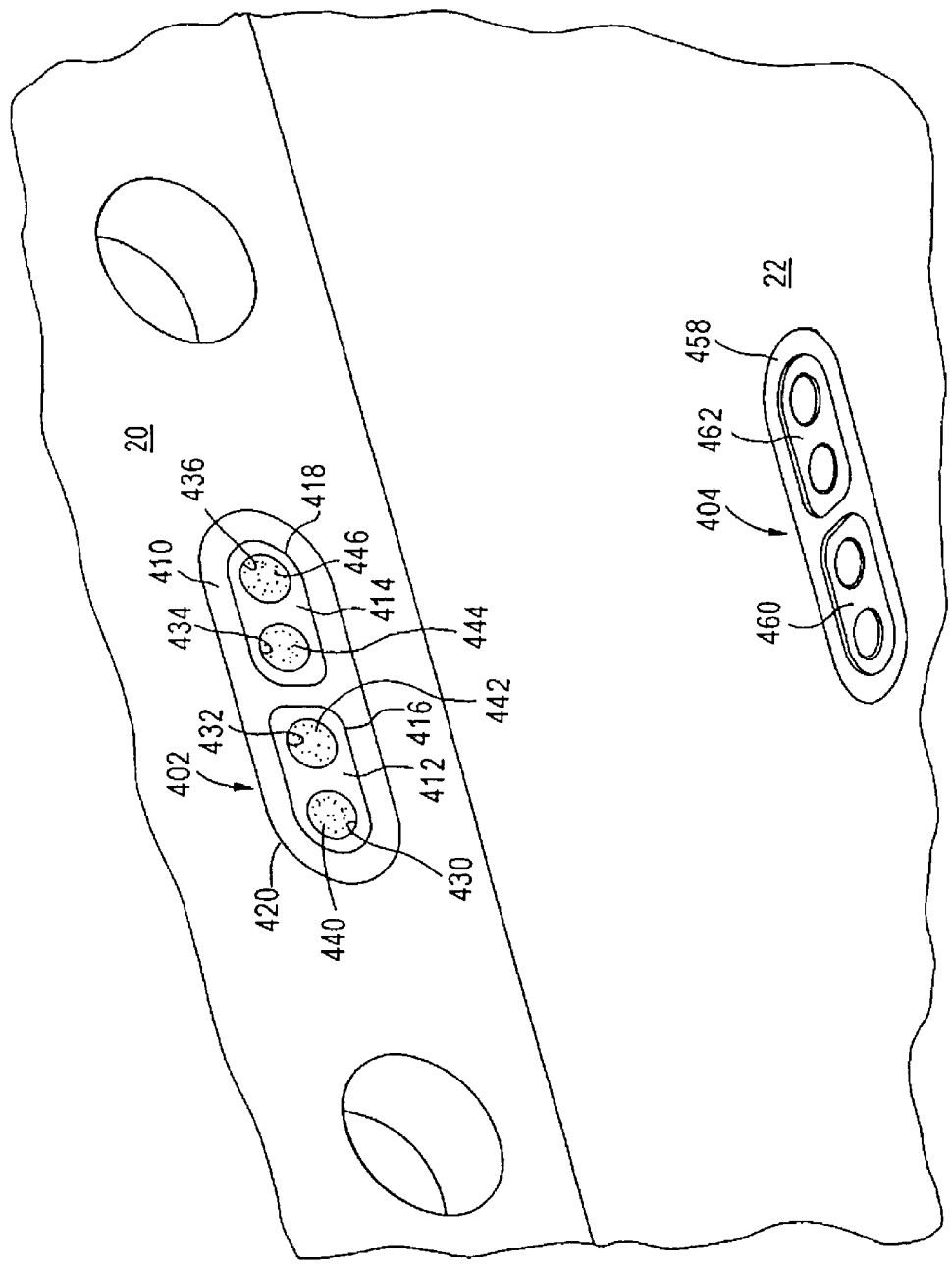
FIG. 8 is a perspective view of the daughtercard and backpanel including PC board patterns.

As depicted in FIG. 8, a plurality of electrically non-conductive patterns 402, 404 are on the daughtercard 20 and the backpanel 22, respectively. The pattern 402 has an electrically conductive area 410 having roughly a figure eight configuration. The patterns can be formed using known photolithographic techniques. A first non-conductive area 412 and a second non-conductive area 414 are spaced apart from each and within an outer periphery 420 of the pattern 402. The first non-conductive area 412 has two areas 430, 432 which include conductive pads 440, 442. The second non-conductive area 414 has two areas 434, 436 which include conductive pads 444, 446. Openings 430, 432, 434, 436 receive the center conductors 120, 122 of twinax cables 40, 42 that extend from the interposer 30 such that conductive spring elements 300, 302, 304, 306 are brought into contact with the conductive pads 440, 442, 444, 446, respectively. Referring back to FIG. 4, conductive spring elements 228, 238, 248 and 258 will be in electrical contact with the electrically conductive area 410. In this manner, the conductive spring elements provide a shielding path to ground. The electrically conductive area 410 is connected to ground plane on the daughtercard and on the backplane. The inner surfaces of openings 430, 432, 434, 436 are electrically conductive and are connected to signal paths so that conductive spring elements 306, 304, 302, 300 are in electrical contact therewith when the interposer 30 is used to connect the daughtercard 20 and the backpanel 22. Conductive spring elements are mounted in the interposer 32. Advantageously, the conductive spring elements 300, 302, 304, 306 will be compressed when the daughtercard and backpanel are mated which provides a normal force on the signal line and on the cable. The conductive spring elements 300, 302, 304, 306 and 228, 238, 248, 258 will be compressed to the board 20 maintaining normal forces with respect to the daughtercard pattern 402. The pattern 404 on the backpanel 22 is the same as the pattern 402 and need not be described in detail herein. The pattern 404 includes an electrically conductive portion 458 and a first non-conductive area 460 and a second non-conductive area 462. Advantageously, the electrical connector 18 of the present invention can be connected and reconnected multiple times without degrading the signal contacts 300, 302.

It should be appreciated that the present invention is usable not only in daughtercard and backpanel or midplane applications but also in vertical motherboards, parallel boards, and cable link connections. It should also be understood that the present invention could also utilize fiber optic connectors to provide simultaneous optical and electrical signals to be transferred through the connector.

Figure 9:
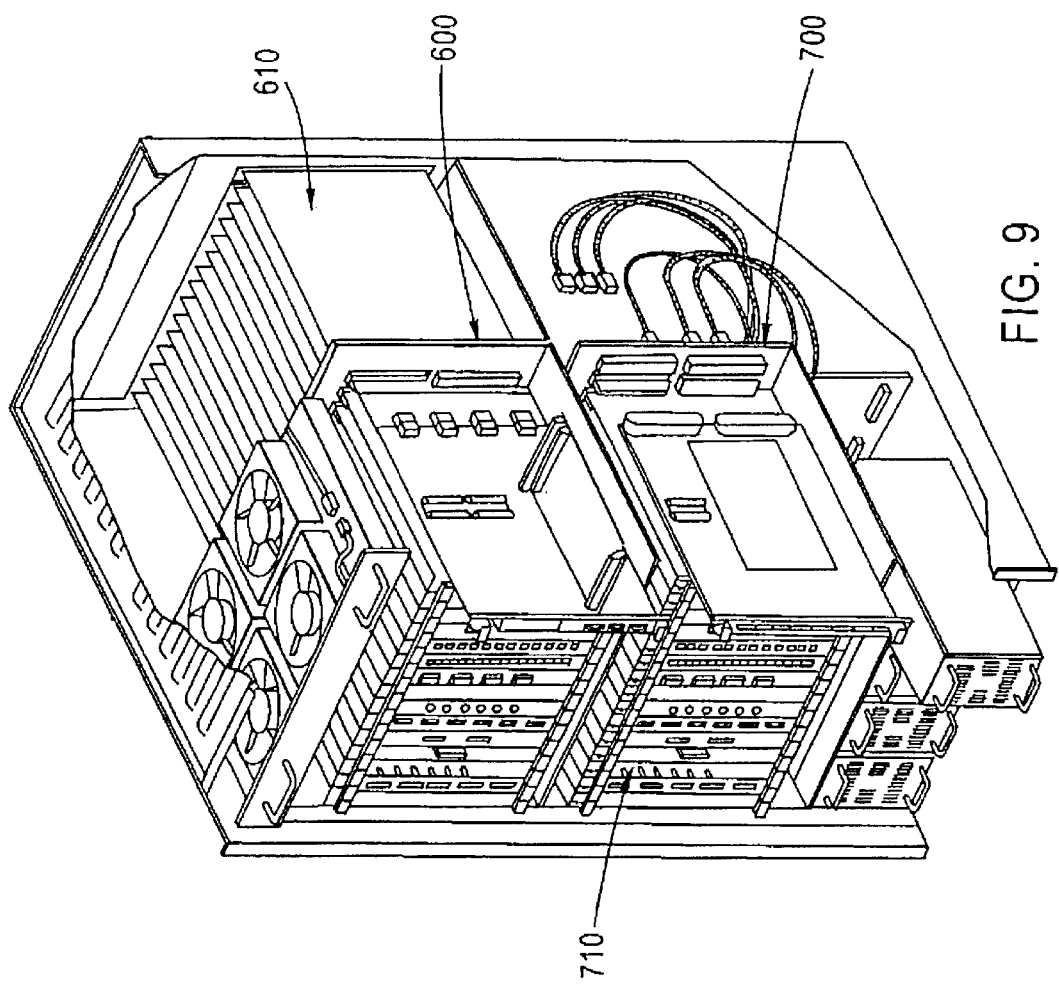
FIG. 9 illustrates a backpanel, mid-panel and daughtercard in an actual application.

Refer now to FIG. 9 where a backpanel 700 is depicted connected to a daughtercard 710. The present invention is also usable in mid-plane connectors such as mid-plane connector 600 depicted in FIG. 9 which is connected to a daughtercard 610.

Figure 10:
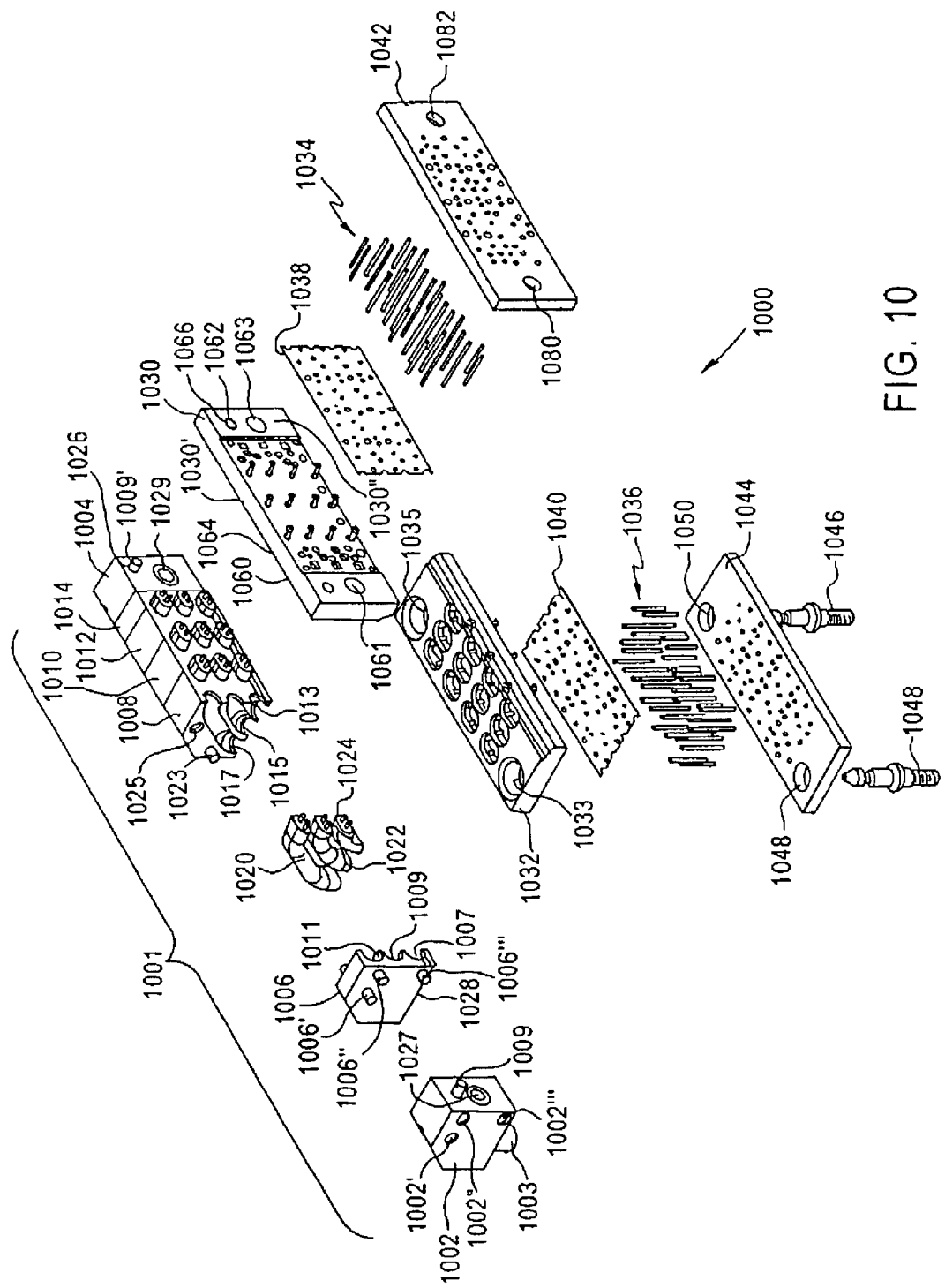
FIG. 10 is an exploded view of a second embodiment of an electrical connector according to the principles of the present invention.
Figure 11:
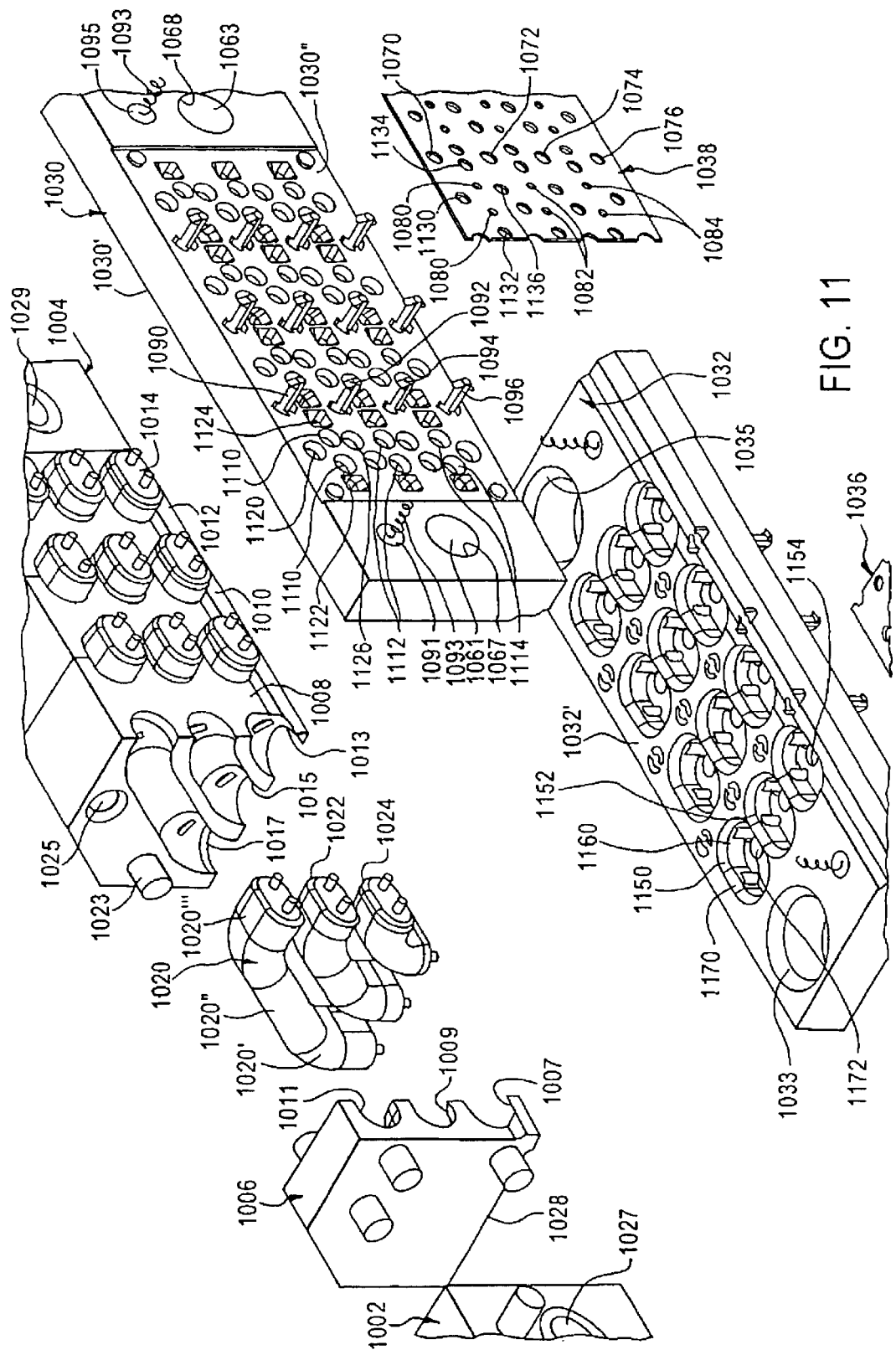
FIG. 11 is an enlarged exploded view of the cable housing interposers according to the present invention.

Refer now to FIG. 10 illustrating a second embodiment of an electrical connector 1000 according to the principles of the present invention. At the outset it should be noted that the electrical conductors 1020, 1022, 1024 have the same electrical characteristics as electrical conductors as 40, 42 illustrated with respect to the first embodiment. As depicted in FIG. 10, electrical conductor 1024 has the shortest path and electrical conductor 1020 has the longest path. Referring to FIG. 11, for example, conductor 1020 has a downwardly extending straight portion 1020', an angled portion 1020" and a horizontally extending straight portion 1020'". The straight portions 1020' and 1020" facilitate installation of ends of the conductor 1020 into cable housing interposers 1030, 1032, as explained below. For ease of explanation, only the housing for conductors 1020, 1022, 1024 is explained here, although other sets of conductors are illustrated which have the same housings. FIGS. 11–14 illustrate additional details of the second embodiment of the present invention.

Referring again to FIG. 10, the electrical connector 1000 includes opposed guide blocks 1002, 1004 mounted on opposite ends of the electrical connector 1000, as discussed in detail below. The guide blocks 1002, 1004 and the cable housings 1006–1014 can either be formed of individual molded parts as depicted and assembled together or can be formed as an over-molded assembly as described previously with respect to FIG. 1B. In between guide blocks 1002, 1004 are a plurality of sets of electrical conductors. As used herein, conductors 1020, 1022, 1024 form one vertical set of conductors. As illustrated in FIG. 10 there are four horizontal sets of three vertically stacked electrical conductors forming a vertical and horizontal array of twinax cable conductors, although it should be appreciated that any number of electrical conductors could be used in the present invention. For example, instead of four sets of conductors, there could be eight sets of conductors. Alternatively, there could be, instead of a stack of three conductors, there could be stacks of two conductors or four or five conductors depending on the application.

Each of the electrical conductors 1020, 1022, 1024 are retained by cable housings 1006, 1008 and the other electrical conductors are retained by the respective cable housings 1008–1014. As depicted in FIG. 10, cable housing 1006 is specially adapted to mate with the guide block 1002 using horizontal pins 1006', 1006" and 1006'" which interlock with corresponding holes 1002', 1002" and 1002'" in the guide block 1002. Housings 1006, 1008 each include recesses 1007, 1009, 1011 and 1013, 1015, 1017, respectively. Each cable housing includes a boss and a hole, for example, in cable housing 1008, there is a boss 1023 and a hole 1025 for interlocking with the cable housing 1006.

As depicted in FIG. 10, the electrical connector 1000 is a right angle 90 degree electrical connector, although other configurations such as a straight connector can be arranged according to the present invention.

The electrical connector 1000 includes a central twinax or coax portion 1001 which includes all of the copper wire conductors 1020, 1022, 1024 and all of the interlocked cable housings 1006–1012, and the guide blocks 1002, 1004. As depicted in FIG. 10, there is a front rectangular surface 1026 and a bottom rectangular surface 1028 to the assembled central assembly 1001. Opposite ends of the conductors 1020, 1022, 1024 extend slightly beyond the surfaces 1026, 1028, respectively, exposing the outer jacket 128 of each of the twinax conductors 1020, 1024. The central conductors 120, 122 extend slightly beyond the dielectric 124 and the outer jacket 128 of the twinax conductors 1020, 1024.

A rectangular interposer 1030 has a front surface 1030' and a back surface 1030". The interposer 1030 mates (surface 1030') with the front surface 1026 of assembly 1001. A second rectangular interposer 1032 having a front surface 1032' and a back surface 1032" mates (surface 1032') with the bottom surface 1028 of assembly 1001. The copper wire conductors 120, 122 engage with the interposers 1030, 1032 as explained below.

A plurality of conductive spring elements 1034, 1036 are retained by Mylar retainers 1038, 1040, respectively. The Mylar retainers 1038, 1040 could be made from any suitable material including heat shrinkable plastic. The conductive spring elements 1034, 1036 are strategically placed and extend within interposer cable housing 1030, 1032 and interposer slides 1042, 1044, respectively. The front surface 1030' of the interposer 1030 is rigidly mounted to the front surface 1026 by either press fit studs, ultrasonic welding or epoxy. A pair of opposed pins 1009, 1009' extend from the surface 1026 and the guide blocks 1002, 1004, respectively, into recessed holes which (not shown) extend inwardly from the surface 1030'. The pins 1009, 1009' keep the interposer 1030 aligned with the cable housings 1006–1014. Pins (not shown) extend from the surface 1026 of the guide blocks 1002, 1004 to keep the interposer 1032 aligned with the cable housings 1006–1014. The conductive spring elements 1034, 1036 include ground contact conductive spring elements and signal carrying conductive spring elements as explained below. A pair of guide pins 1046, 1048 are provided on the backpanel for mounting the electrical connector 1000 thereto. Guide pins 1046, 1048 extend through holes 1050, 1035 and 1048, 1033, respectively, and mate with the latching mechanisms described below. As depicted in FIG. 10, a cylindrical guide socket body 1003 extends from the guide block 1002 for receiving the guide pin 1048. Guide block 1004 has a similar guide socket body (not shown) for receiving guide pin 1046. The guide blocks 1002, 1004 each have a threaded insert 1027, 1029, respectively, positioned at right angles from the guide socket body 1003 and aligned with corresponding holes 1061, 1063 in interposer 1030 and holes 1080, 1082 in the interposer slide 1042. Threaded fasteners extend from the daughtercard to fasten the electrical connector 1000 to be threaded into the threaded inserts 1027, 1029.

Turning now to FIG. 11, it can be more clearly seen that the Mylar sheet 1038 includes a plurality of stamped holes. The stamped holes are in a specific pattern for retaining and placing the conductive spring elements in holes in the interposers 1030, 1032 and the interposer slides 1042, 1044. The holes used to retain the signal carrying conductive spring elements must be held to tight tolerances to hold the conductive spring elements securely yet not so tight to overly compress the conductive spring elements and significantly change the outer diameter thereof.

Stamped holes 1070, 1072, 1074 and 1076 are in vertical alignment for receiving retaining tines 1090, 1092, 1094, 1096 in the interposer 1030. The holes 1404, 1406 and the retaining tines 1090–1096 maintain the interposer slide 1042 in alignment with the interposer 1030. The retaining tines 1090–1096 are of sufficient length to permit the interposer slide 1042 to be biased into the extended position by springs 1091, 1093 mounted in holes 1095, 1097 in the surface 1030" of the interposer 1030. The retaining tines 1090–1096 will be flush or below surface 1092 in the retracted position.

Figure 12:
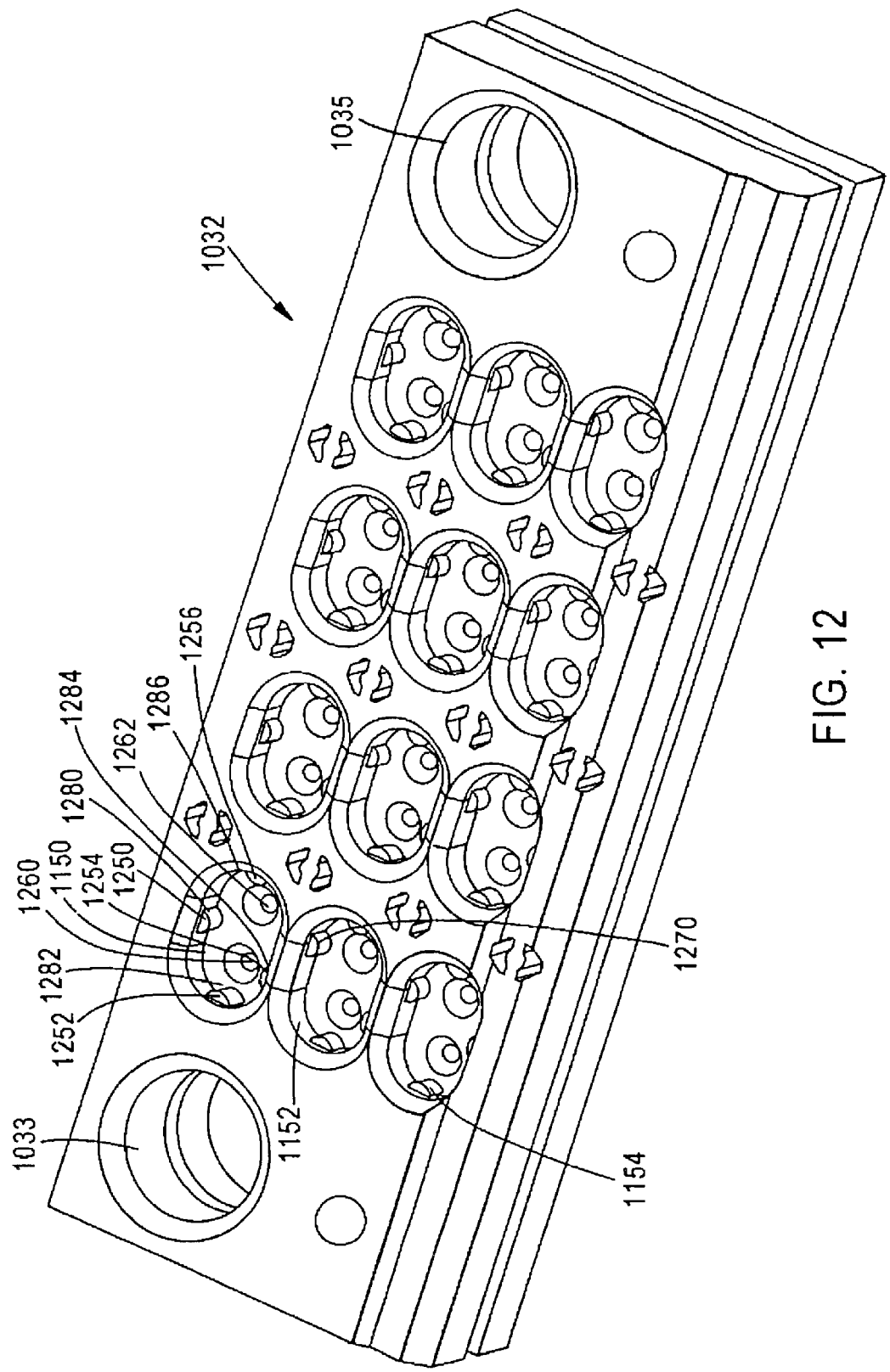
FIG. 12 is an enlarged view of a front side of the interposer cable housing shown in FIG. 10 according to the present invention.
Figure 13:
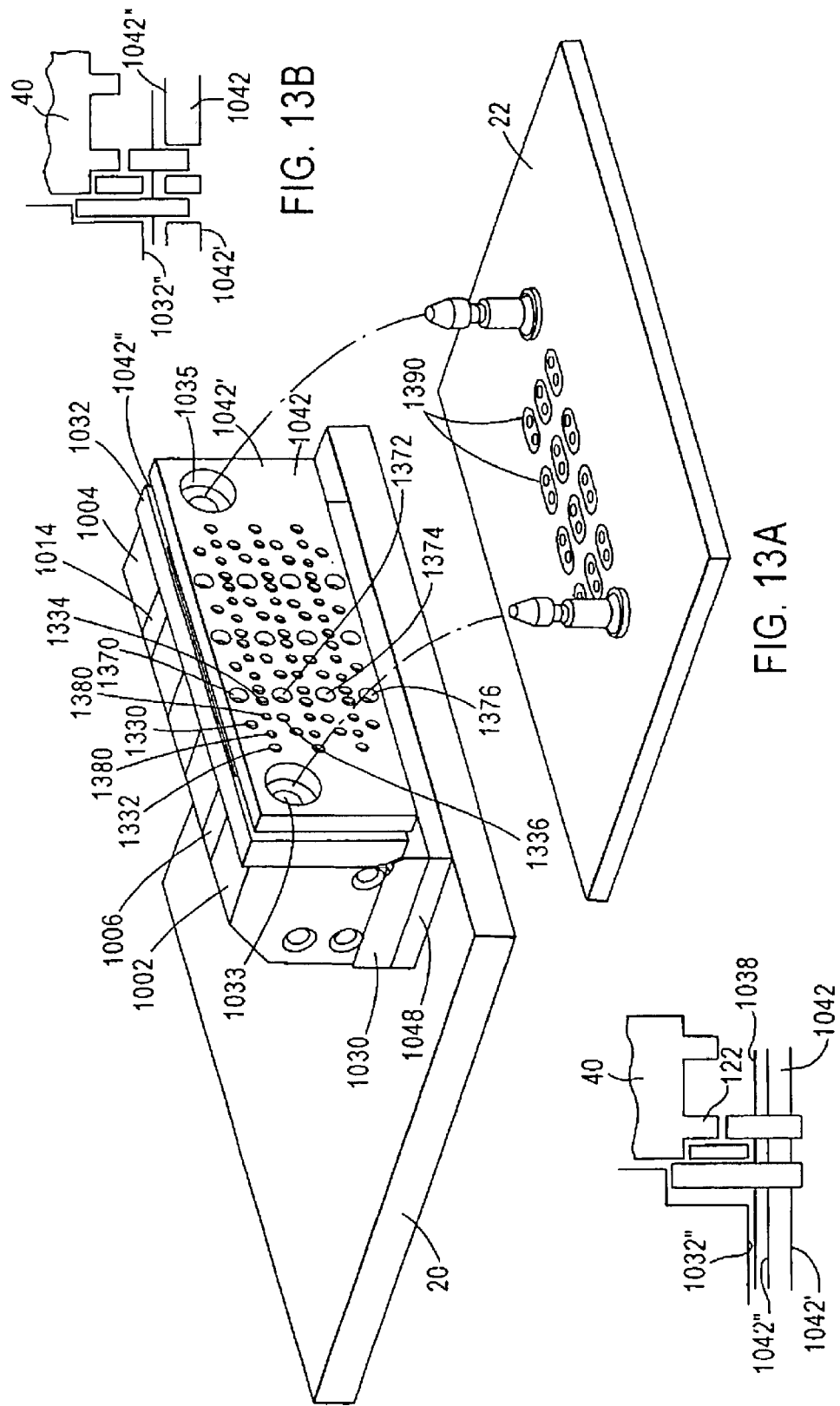
FIG. 13A is a perspective view of the electrical connector of the present invention mounted to a daughtercard with the daughtercard interposer slide being in a retracted position and the backpanel interposer slide being in an extended position.
FIG. 13B is a cross-sectional view of conductive spring elements being retained by the Mylar sheet illustrating one end of the conductive spring elements within the interposer slide when the interposer slide is in an extended position.
FIG. 13C is a cross-sectional view similar to FIG. 13B illustrating the one end of the conductive spring elements extending beyond the interposer slide when the interposer slide is in a retracted position.
Figure 14:
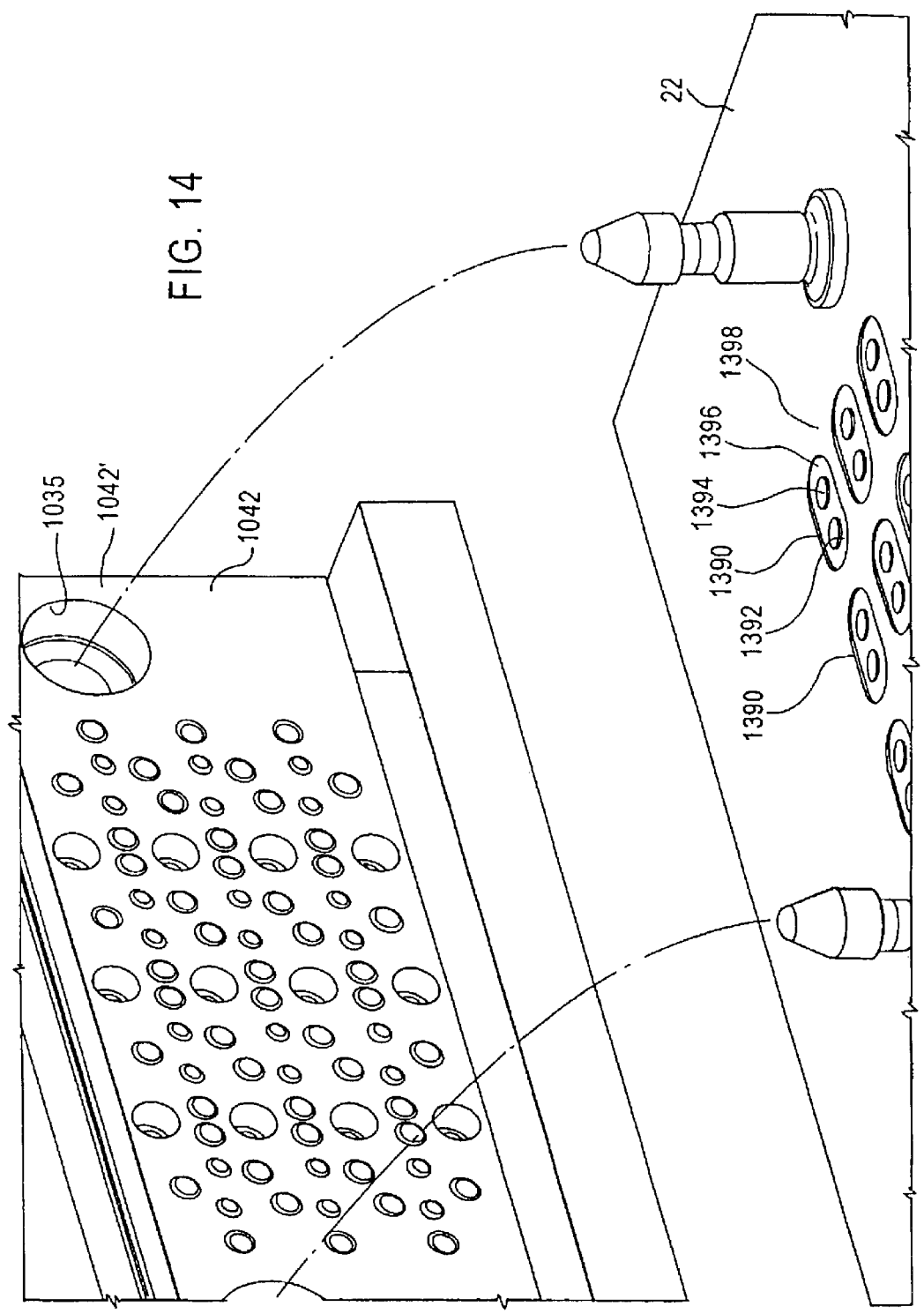
FIG. 14 is a view of the interposer slide mating face.

The conductive spring elements 1034 maintain the alignment of the Mylar sheet 1038 relative to the interposer 1030 and the interposer slide 1042. The interposer 1030 includes a top set of holes 1110 for receiving the leads of conductor 1020, middle holes 1112 for receiving the center leads of conductor 1022 and a bottom set of holes 1114 for receiving the leads of the conductor 1024. Each interposer has multiple ground holes, for example, four ground holes, into which conductive spring elements are placed to make contact with the outer conductive layer 128 of each of the conductors 1020, 1022, 1024. For example, as depicted in FIG. 11 with respect to conductor 1020, the interposer 1030 has holes 1120, 1122, 1124, 1126. The Mylar sheet has corresponding holes 1130, 1132, 1134, 1136. Each interposer 1030, 1032 includes a plurality of recesses shaped to match the exterior of each of the conductors 1020, 1022, 1024. As depicted in FIGS. 11 and 12, the electrical conductors have a straight center section and rounded outer sections. The conductive spring elements placed in holes 1130, 1132, 1134, 1136 will be in contact with the outer jacket 128 of the conductor and will provide a ground path and electrical shield between adjacent twinax cables. The recess 1150 extends inwardly from front surface 1032' of the interposer 1032. For example, the recess 1150 is formed by opposed curved walls 1160, 1162 connected by straight sections 1170, 1172. The straight sections 1170, 1172, as depicted extend horizontally. The recess 1150 is shaped to receive the outer jacket 128 of the twinax cable.

Turning now to FIG. 12, the interposer 1032 is depicted in large scale. It should be understood that interposers 1030, 1032 are identical except for the opposed holes used for the guide pins 1046, 1048 which extend through interposer 1032 into guide blocks 1002, 1004, respectively. The holes 1048, 1050 are offset relative to a longitudinal centerline of the interposer slide 1044 as are holes 1033, 1035 which are aligned therewith. By contrast, the holes 1066, 1068 in the interposer 1030 are on the centerline as are the holes in the interposer slide 1048.

Each central conductor 120, 122 have multiple conductive spring elements associated with it. For example, as depicted in FIG. 12, there are two holes 1260, 1262 aligned with the central conductors 120, 122. There are also two central conductive spring elements (not shown) which make contact with the central leads of the conductors 120, 122 and which have one end in the holes 1260, 1262. A front surface of the insulator 124 can bottom out in the recess 1150. With respect to the recess 1150, there are four conductive spring elements 1250, 1252, 1254, 1256 installed in holes 1280–1284. Holes 1280–1284 are blind holes and intersect with the periphery of the recess 1150. One ground contact, preferably a conductive spring element (not shown) is installed in the holes 1250–1256 and are used as ground contacts with the electrically conductive outer jacket 128 of the central conductor. Four ground contacts provide excellent shielding. Additional holes and conductive spring elements can be added to enhance cross-talk reduction.

It should be noted that hole 1250 is centrally located between signal carrying conductive spring elements 1260, 1262. Hole 1254 is offset relative to the center of recess 1150 closer to hole 1260, whereas in the adjoining recess 1152, hole 1270 is offset in the opposite direction. It should be noted that excellent electrical shielding is achieved without having to provide 360 degree coverage of each of the twinax cables. Thus, adjacent vertically aligned recesses have offset holes for conductive spring elements. By offsetting the holes, a greater percentage of the circumference is shielded.

Referring now to FIGS. 13A, B and C and referring to the interposer slide 1042, it should be seen that there are four vertically aligned holes 1370, 1372, 1374, 1376 for receiving tines 1090, 1092, 1094, 1096, respectively. Preferably, the interposer 130 will be spring loaded in a direction away from interposer 1030. This protects the conductive spring elements from becoming damaged or dislodged during shipping and assembly. It should be understood that the explanation is provided only for the left most set of holes and that the hole pattern repeats. The upper most conductor 1020 has a set of corresponding holes in the interposer 1042. Hole 1330 for receiving a ground conductive spring element aligns with hole 1130 in the Mylar sheet and hole 1120 in interposer 1030. Hole 1332 aligns with hole 1132 in the Mylar sheet and hole 1122 in the interposer. Hole 1334 aligns with hole 1134 in the Mylar sheet and hole 1124 in the interposer 1030. Hole 1336 aligns with hole 1136 in the Mylar sheet and hole 1126 in interposer 1030. Similarly, holes 1380 align with holes 1080 in the Mylar sheet 1038 and holes 1110 in the interposer 1030. As depicted in FIG. 13A, the interposer 1032 is illustrated in an extended position in which the conductive spring elements are below the surface 1042" or at maximum 0.020 above the surface 1042" and are thereby protected during shipment of the electrical conductor 1000. As depicted in FIG. 13A, there is a gap between the surface 1032" of the interposer 1032 and the surface 1042 of the interposer slide. The conductive spring elements are held between the interposer 1030 and the interposer slide 1048 are in contact with the daughtercard 20. By contrast, the interposer 1032 and the interposer slide 1044 are in contact with the backpanel 22.

The backpanel printed circuit board with guide has a plurality of conductive pads 1390. The pads have two signal carrying conductors 1392, 1394 to be brought into contact with the signal carrying conductive spring elements and an outer ground section 1396 (see FIG. 14). The pads 1390 advantageously do not have to be through plated holes. The pads 1390 can be surface mount or can have blind vias. By avoiding through plated holes, capacitive effects associated with the holes are reduced and speed can be increased.

It is important to provide shielding for the length of the exposed central conductor and for the length of the signal carrying conductive spring elements to prevent cross-talk between adjacent twinax cables. The present invention advantageously achieves this shielding using four conductive spring elements connected to ground. These conductive spring elements provide less than 360° shielding but testing has revealed that the level of shielding achieved is sufficient to provide data rates up to 10 Gb/sec and greater.

Further, the Mylar sheet 1038 retains the signal carrying conductive spring elements by compressing the conductive spring elements around the circumference without reducing the outer diameter significantly. Thus, the diameter of the conductive spring elements is not changed significantly when compressed into the PC board. Also advantageously, the force exerted by the conductive spring element in a direction away from the PC board is relatively small thus allowing the use of the latching mechanism according to the present invention. By changing the shape, number and rigidity of the conducting elements, the contact resistance, contact force and compressibility can be selected within a wide range to meet the needs of the particular application. The overall cumulative contact force of conductive spring elements 1039, 1036 against contact surfaces 1390 is low due to the resilient construction and compressibility of the conductive spring elements.

Because the electrical connector according to the present invention is a compression mount-type, a unique latching device is preferably used with the electrical connector depicted in FIGS. 10–14. To ensure a good electrical connection, between the conductive spring elements and the PC board pads, the daughtercards must not be able to back out of its position in the slot beyond a predetermined distance. This predetermined distance is calculated to ensure the minimum amount of normal force required for an acceptable electrical connection. The latching device can advantageously be used with all compression mount type connectors and is not limited to the compression type connector described herein. A connector guidance module is used as device for maintaining a latched position for an interconnect system. The latching device maintains intimate contact between compression mount contacts (conductive spring elements) and the PC board surface without using additional fasteners. The latching device will operate very similarly to a quick disconnect hose fitting, but will not necessarily have a positive lock requiring more than just enough force to disengage the latch device. The spring members and guide pin shape are designed for mating of the latching device with a minimum of force into a latched position. A groove in the guide pin and the latching device are designed to require more force to separate than the force generated by he compression contacts against the PC board in a direction to force the latching into an unlatched position.

Figure 26:
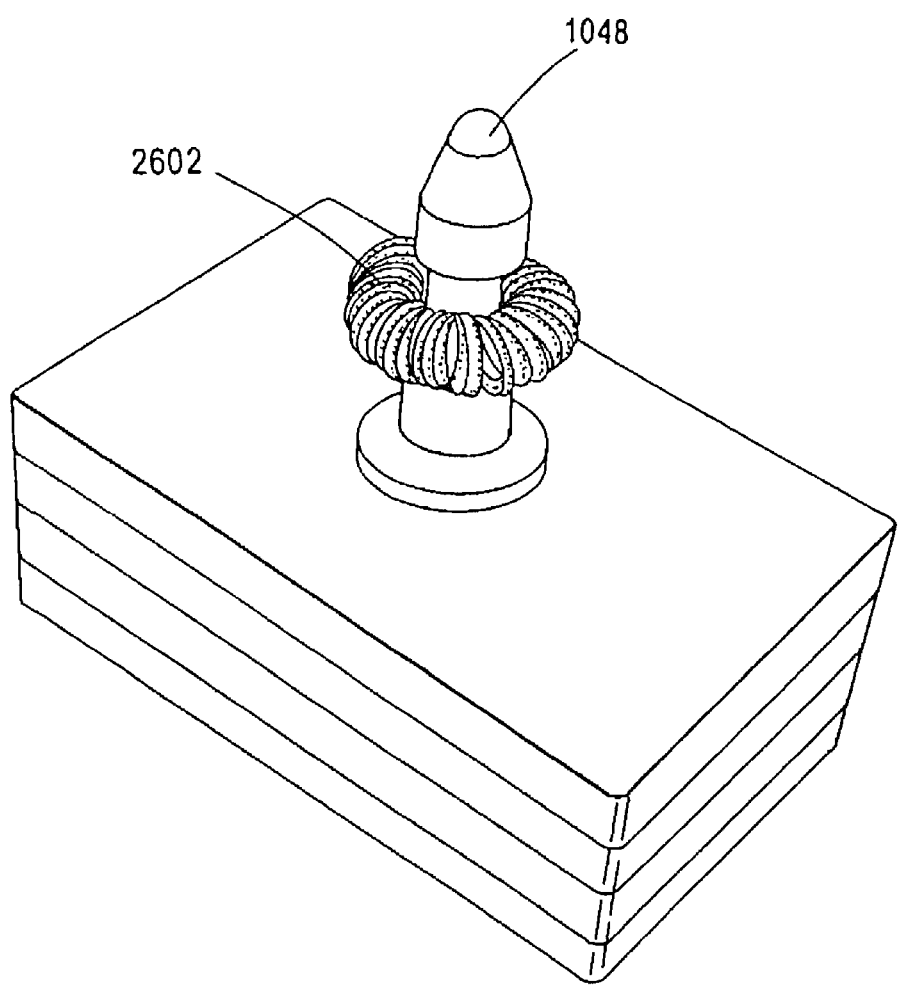
FIG. 26 depicts a second embodiment of a latching mechanism according to the principles of the present invention.

Other arrangements for the latching mechanism would include but are not limited to replacing the spring members shown with another type of spring, such as a (garter spring) extension coil as depicted in FIG. 26. The latching devices shown here have a cylindrical cross-section may be replaced with spherical ball component. The "groove" in the guide pin is shown here as having a shape to closely match the latching devices' shape, but may be replaced with a simple "V" groove and/or for retention "U" groove.

Figure 15:
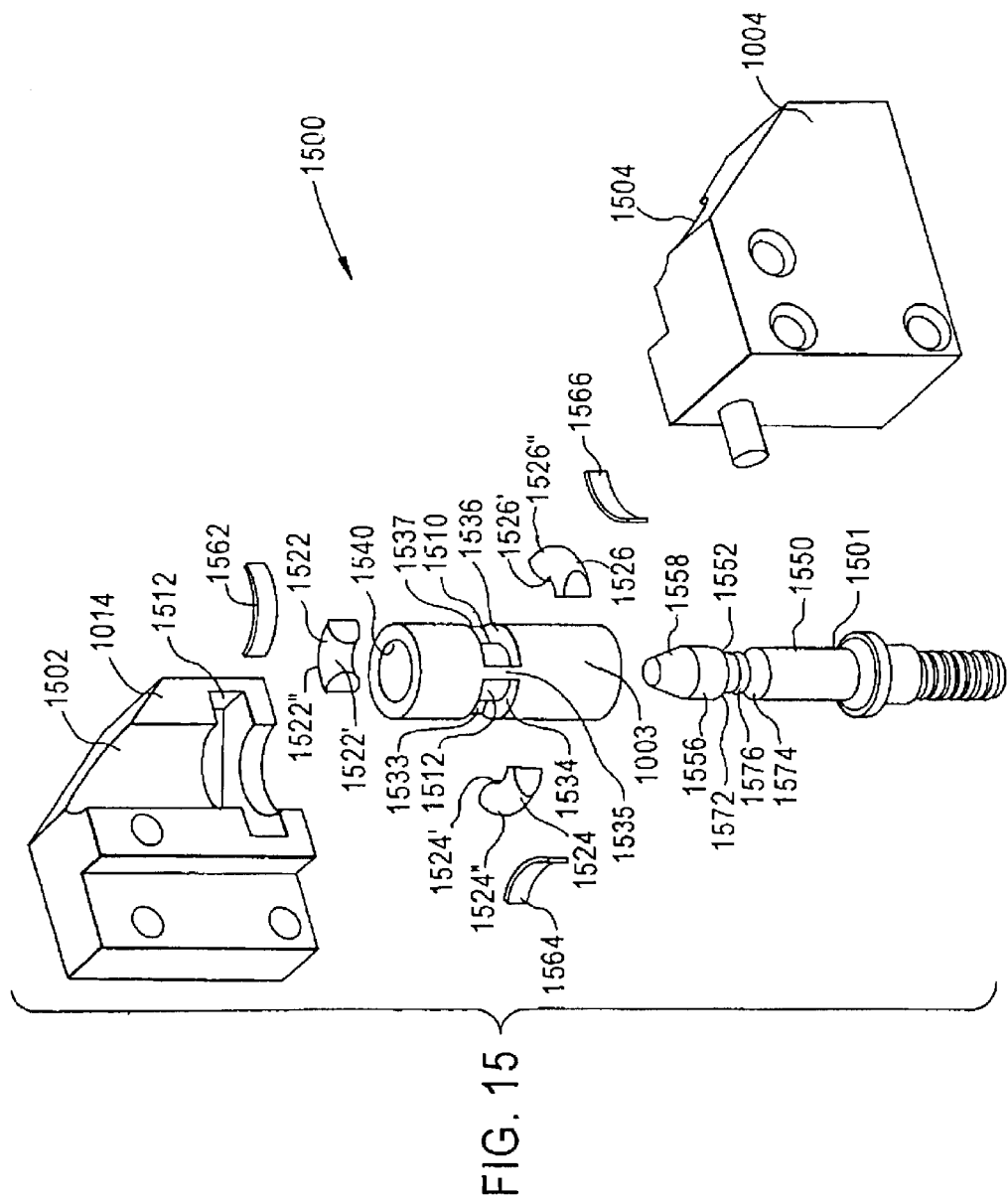
FIG. 15 is an exploded view of a latching guide module according to the present invention.

Referring now to FIG. 15, a latching guide module 1500 is depicted in an exploded perspective view. The latching guide module is especially useful when used in combination with the second embodiment depicted in FIGS. 10–14. As depicted in FIG. 15, there is a housing or guide block 1002 and a cable housing block 1006. Housing 1002 and housing 1006 each have a portion or half of a through bore 1502, 1504, respectively. A guide socket body 1510 is mounted within the bore formed by 1502, 1504 and is retained therein as discussed in detail below.

Each housing 1502, 1504 has a slot 1512 and 1514 (not shown). The slots 1512, 1514 are transverse relative to the through bore. The guide socket body has three spaced circumferential arcuate slots 1532 (not shown) 1534 and 1536 spaced by walls 1533, 1535, 1537, respectively. The latching devices 1522, 1524, 1526 fit into slots 1532, 1534, 1536, respectively. The latching devices 1522–1526 each have an annular arcuate shape with an inner surface 1522'–1526' and an outer surface 1522"–1526". The guide pin 1048 has an outer cylindrical surface 1550 and an annular groove 1552. The groove 1552 has two opposed angled sections 1572, 1574 and a straight section 1576 connecting the angled sections 1572, 1574. The inner surfaces 1522'–1526' are shaped to match the shape of the annular groove 1552. Three arcuate shaped leaf spring members 1562, 1564 and 1566 are mounted within grooves 1512, 1514 and are in contact with latching devices 1522, 1524, 1526, respectively. The guide socket body 1510 is retained in the through bore by a combination of three latching devices 1522, 1524, 1526 and the springs 1652, 1564, 1566 which bias the latching devices inwardly.

Each of the twinax cable embodiments is particularly suitable for differential signaling. A driver on one board sends out two signals and at the receiving board, the difference between the two signals is measured and the actual signal pulse is determined. Because the two conductors are shielded from adjacent twinax cables by the conductive jacket, the twinax cable is especially useful for differential signaling. With a differential pair each signal is transmitted on two lines 140, 142 at the same time. On one, the signal is transmitted as a positive (+) signal, on the other as a negative (−) signal. At the receiving end of the signal path the receiver device gets two signals. Both signals, however, have been changed by the noise that penetrated through the outer jacket 128 and through the conductive spring element shielding over the signal path. The changes came in the form of unwanted voltage added to the wanted signal. At this point it is important to note that the unwanted voltage is added to both lines at the same time and by the same amount. The essence of the differential system is that the receiver is designed to subtract the difference between the two signals on the two lines. In doing that, because the noise part of the signal is equal on both lines, the noise cancels out and effectively is eliminated. As indicated above, the differential system works well if the noise added is equal on the two lines, i.e., the positive (+) and the negative (−). To ensure that the noise affects both of these lines identically, both of them need to occupy theoretically the same physical space. This is true in the present invention in which the two physical lines are within the twinax cable structure.

Figure 16:
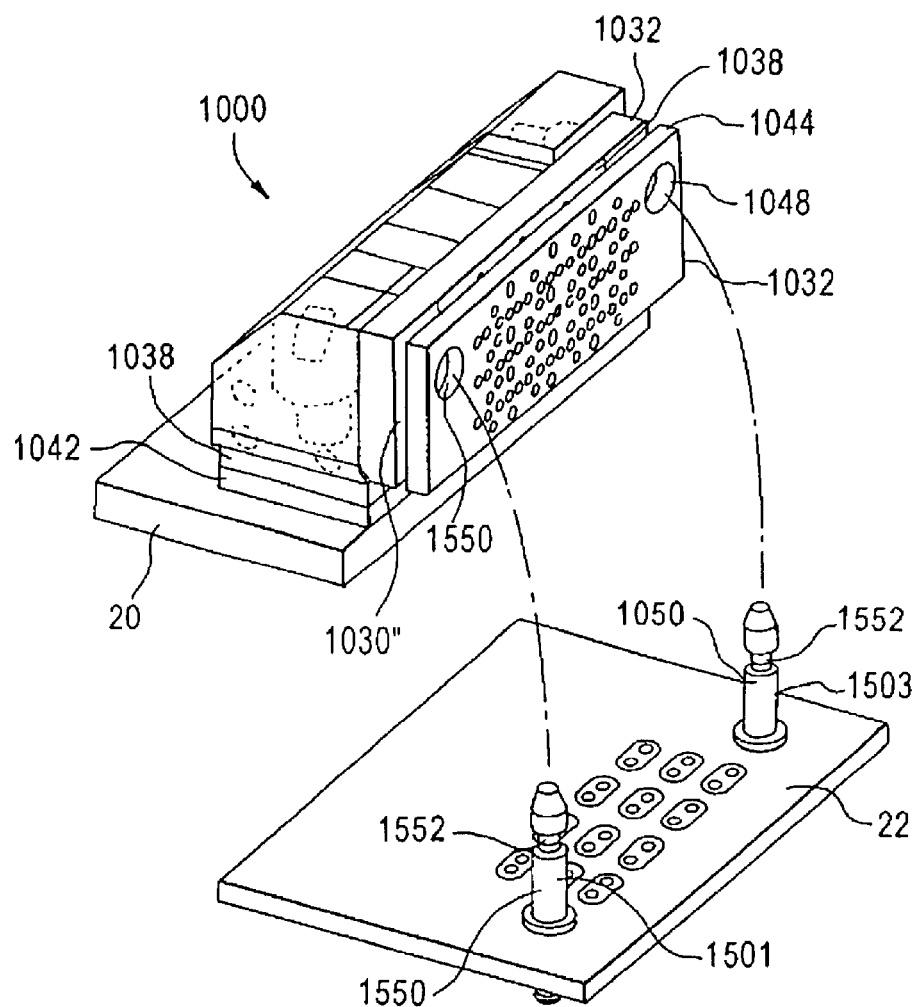
FIG. 16 depicts the electrical connector mounted to a daughtercard with the daughtercard interposer slide in a retracted engaged position and a backpanel interposer slide in an extended unengaged position.
Figure 17:
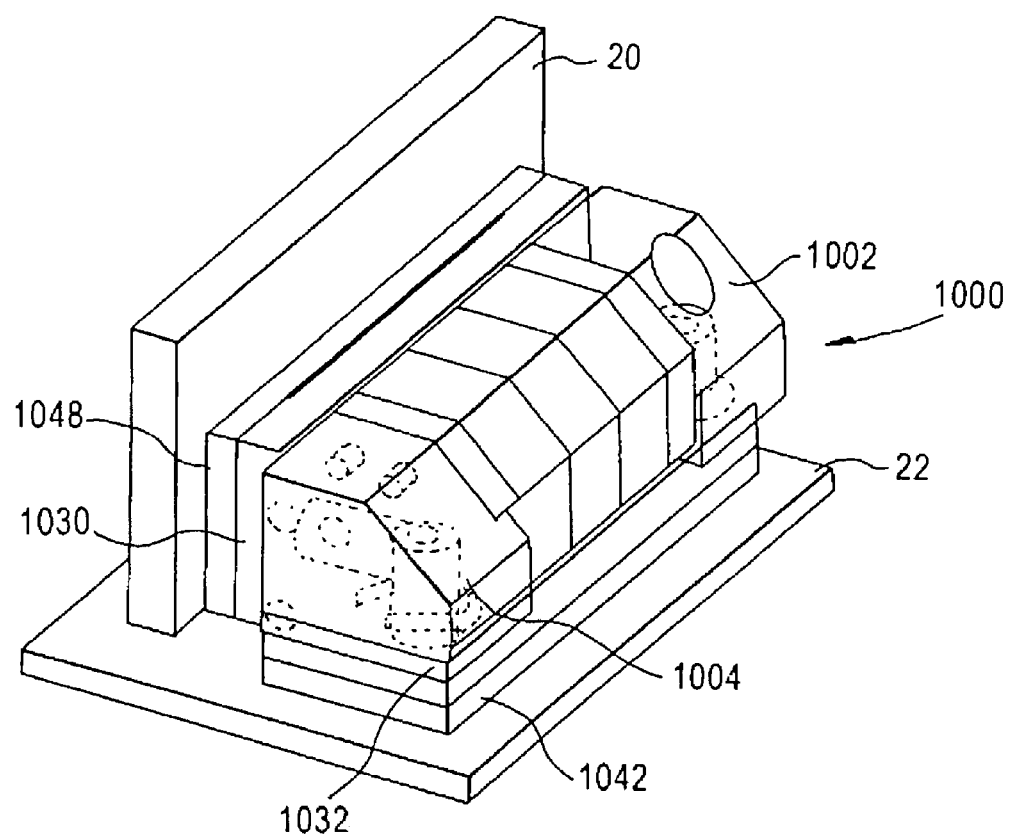
FIG. 17 depicts the electrical connector mounted to a daughtercard and mated to a backpanel.

Referring now to FIG. 16, the electrical connector 1000 is shown engaged with the daughtercard 20. The interposer slide 1042 is depicted in a retracted engaged position. The interposer slide 1044 is shown in an extended non-engaged position. The Mylar sheet 1038 is in contact with the surface 1030". When interposer slide 1044 engages with the top surface of the backpanel 22, the interposer slide 1044 will slide inwardly to a retracted engaged position. The latching mechanism will engage with the grooves 1552 of pins 1501, 1503 such that all of the conductive spring elements will be in proper contact with the daughtercard and backpanel pads. This is depicted in FIG. 17 where the electrical connector 1000 is connected to the daughtercard 20 and the backpanel 22.

Figure 18:
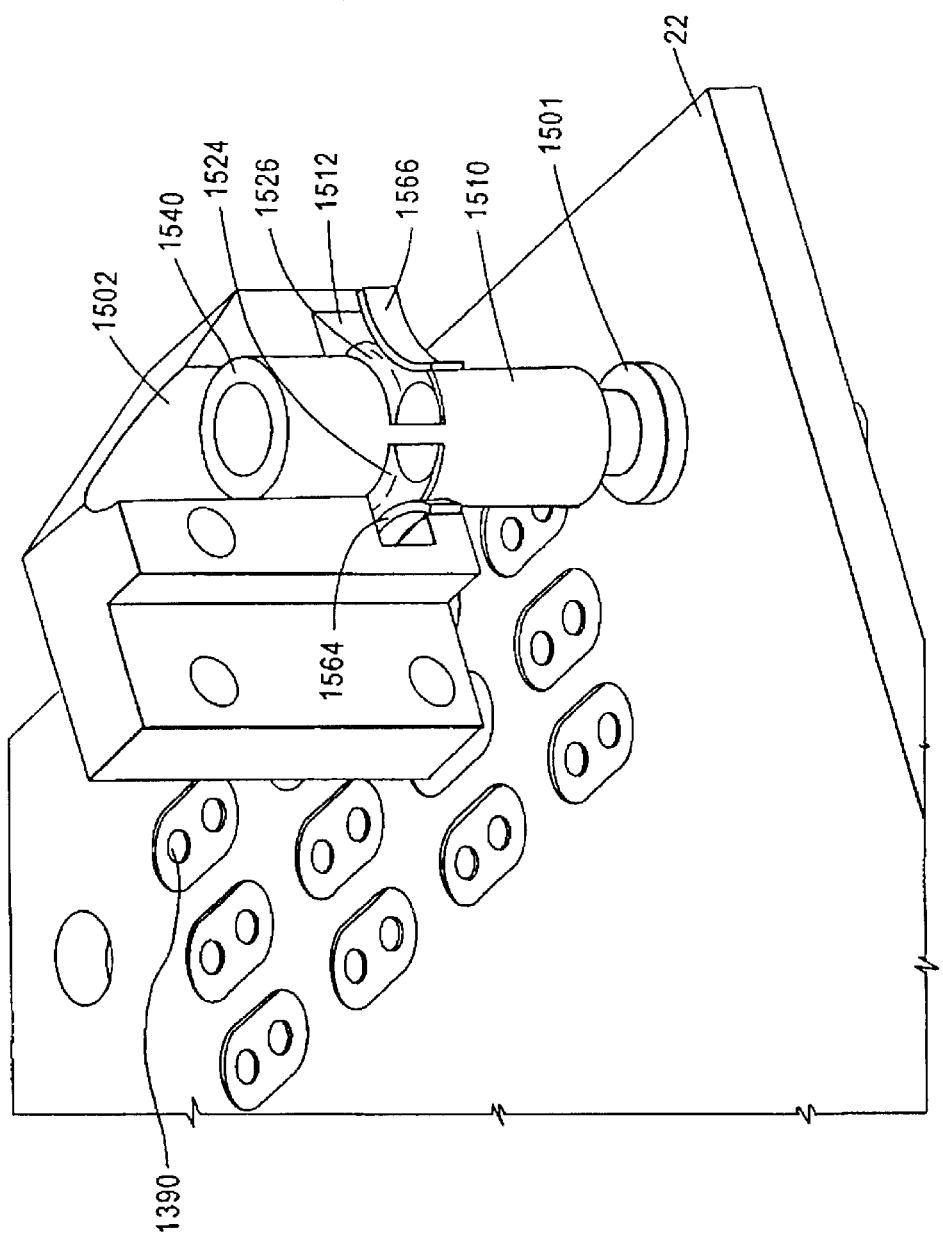
FIG. 18 depicts the guide module, in a fully mated state, with one half of the housing omitted to expose the operating components of the assembly.

Turning now to FIG. 18, the guide module is depicted in a fully mated state, with one half of the housing removed to better expose the latching mechanism. The springs 1564–1566 and the latching devices 1564, 1566 are shown in a normal latched engaged position. The springs 1562–1566 bias the latching devices into the groove 1552.

Figure 19:
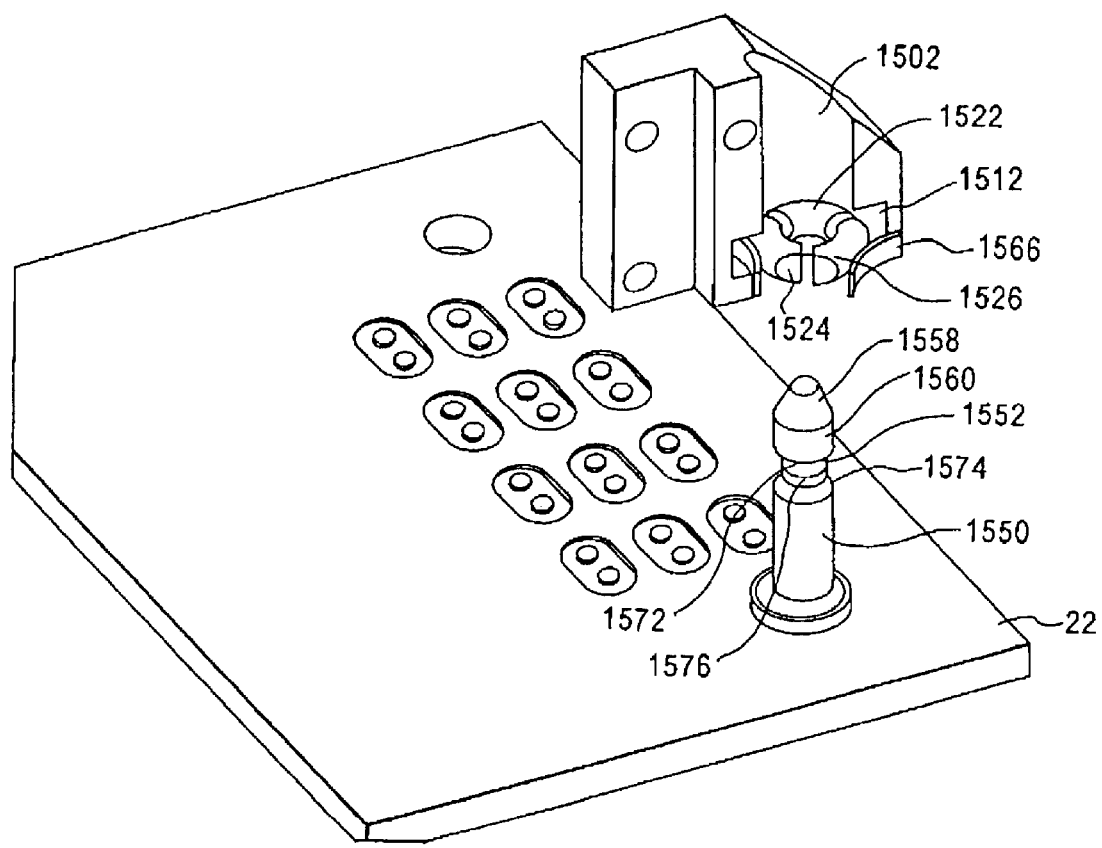
FIG. 19 depicts the guide module, in an unmated state, with one half of the housing removed and the guide socket omitted to expose the operating components of the assembly.

FIG. 19 depicts the guide module with the latching mechanism in the normal unmated condition.

Figure 20:
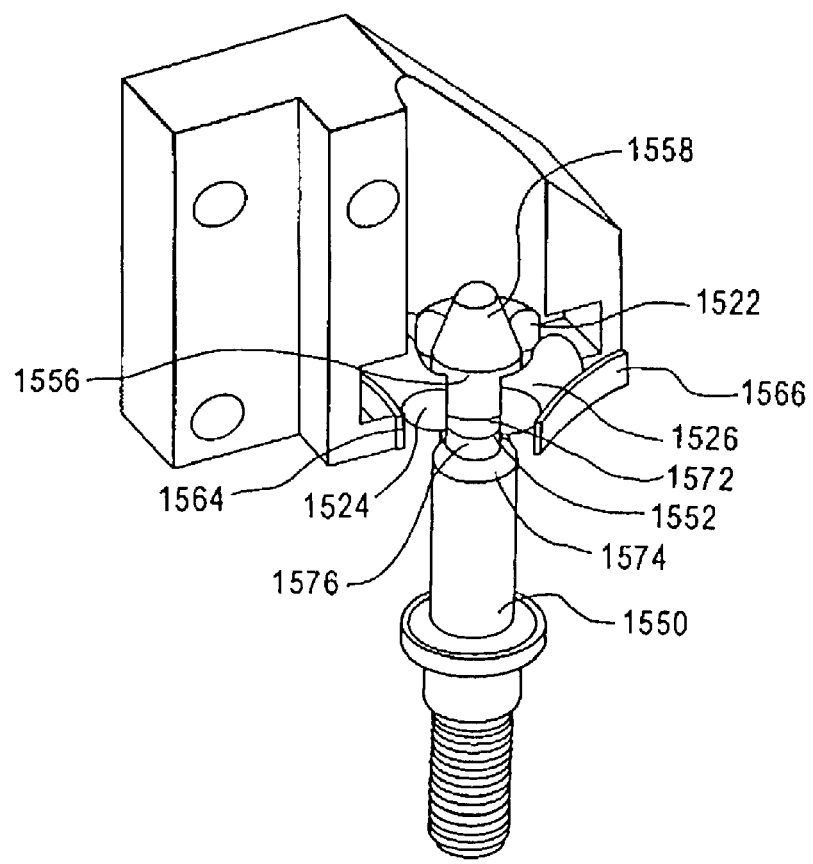
FIG. 20 depicts the guide module, in a partially mated state, with one half of the housing removed and the guide socket omitted to expose the operating components of the assembly. This illustrates the movement of the springs and latching devices during the mating process.
Figure 23:
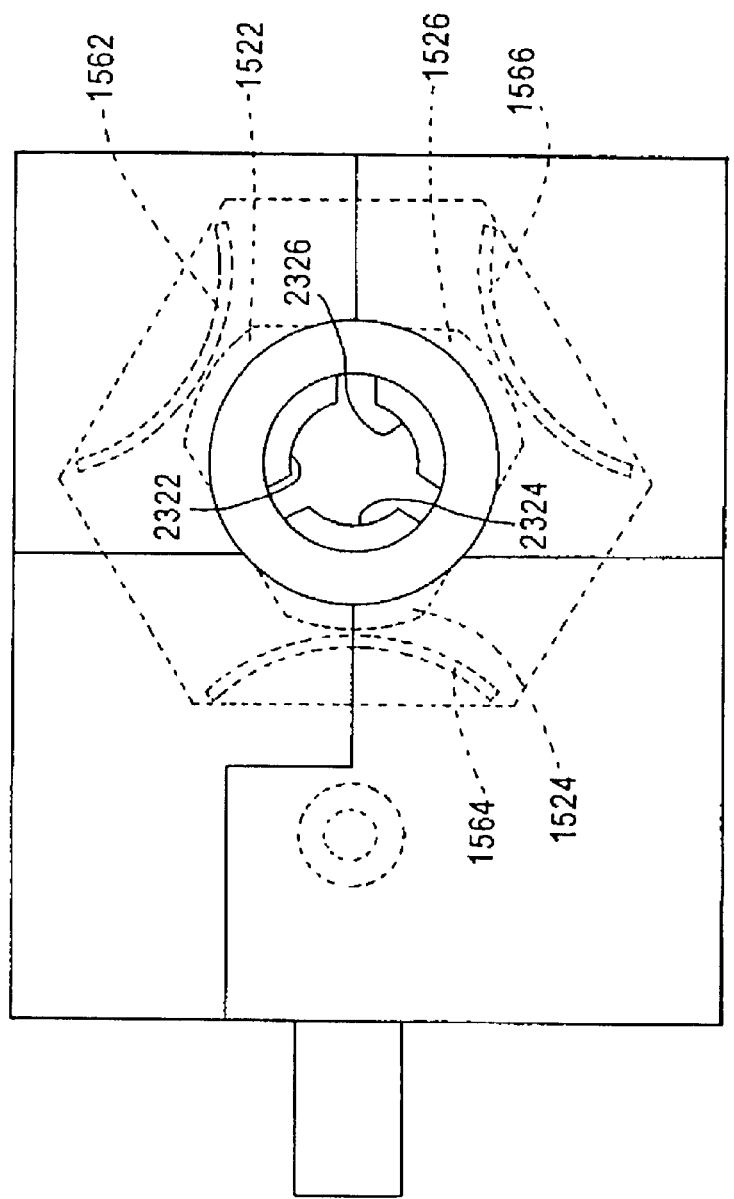
FIG. 23 is the same as FIG. 22 with the guide socket in place with the latching devices in the "closed" position.

FIG. 20 depicts the guide module, in a partially mated condition, with one half of the housing removed and the guide socket 1510 omitted to expose the latching mechanism. This illustrates how the springs and latching devices operate during the mating process. In FIG. 20, the spring members 1562–1566 bias the latching devices 1522–1526 inwardly. In the partially mated condition the inner surfaces 1522'–1526' are in contact with cylindrical surface 1558 of the guide pin 1550. When the guide pin 1510 engages the latching devices 1522–1526, the latching devices 1522–1526 are biased radially inwardly as depicted in FIG. 23 and the latching devices 1522–1526 extend inwardly past the slots 1512–1516 such that the inner surfaces 1522'–1526' engage the groove 1552. The guide pin 1501 has a tapered top section 1558 to facilitate engagement with the latching devices 1522–1526. The insertion force overcomes the spring bias exerted by spring members 1562–1566 such that the latching devices 1522–1526 move radially outwardly until the latching devices are biased inwardly into the grooves 1552. Advantageously, the force exerted by the springs 1562–1566 is sufficient to maintain force on the conductive spring elements to keep the conductive spring elements engaged with the pads. However, there is no positive lock using this latching device but merely a friction fit sufficient to hold the electrical connector in place against the daughtercard.

Figure 21:
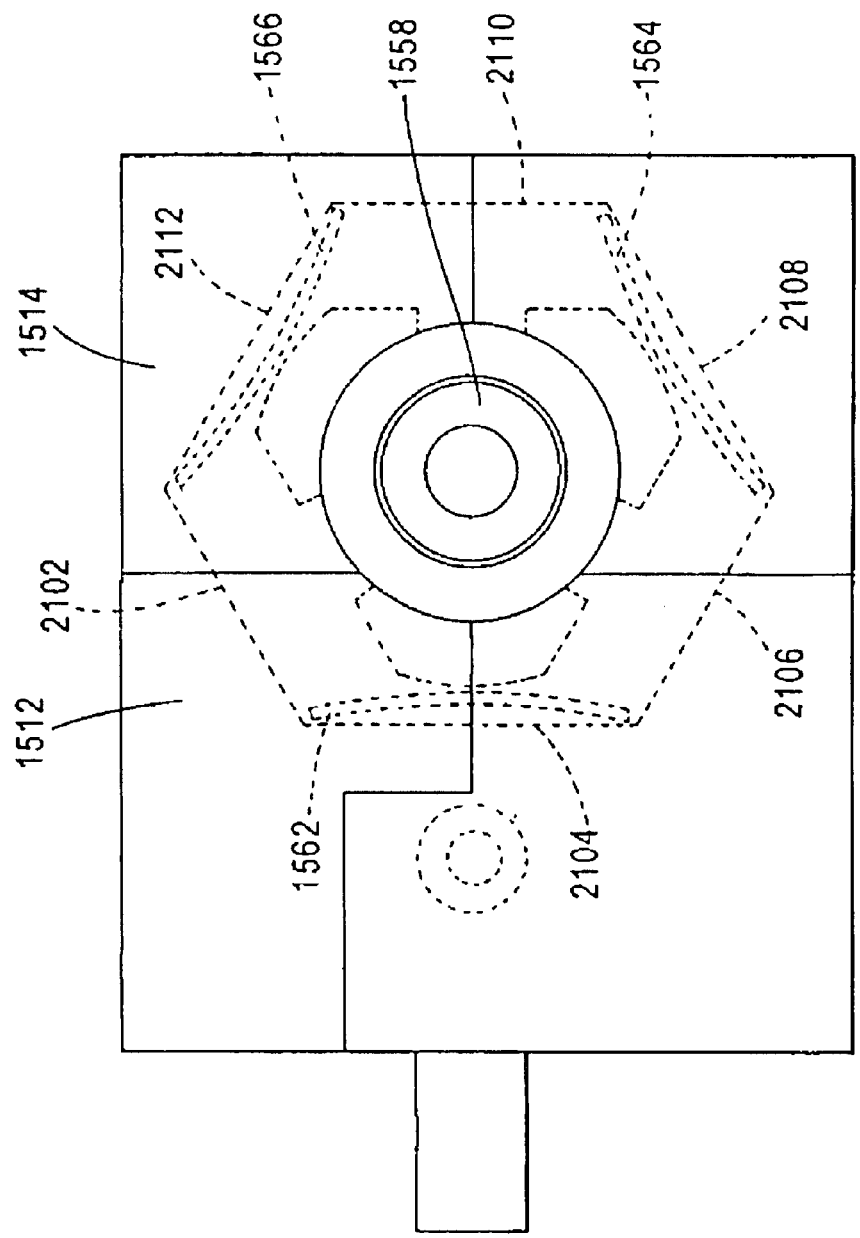
FIG. 21 depicts the guide module, from the back side, with the guide pin in the full installed position.

FIG. 21 depicts the guide module, in a top view with the guide pin 1501 in the fully installed position. In FIG. 21, the grooves 1512, 1514 are illustrated in a top view. Together slots 1512, 1514 from a hexagonal shape have walls 2102, 2104, 2106, 2108, 2110 and 2112. In FIG. 21, springs 1562, 1564, 1566 are engaged with walls 2104, 2108, 2112 respectively. As depicted in FIGS. 15–25, there are three latching devices and springs depicted, although any number can be used. As depicted in FIGS. 15–25, the latching devices and springs are separated by 120°.

Figure 22:
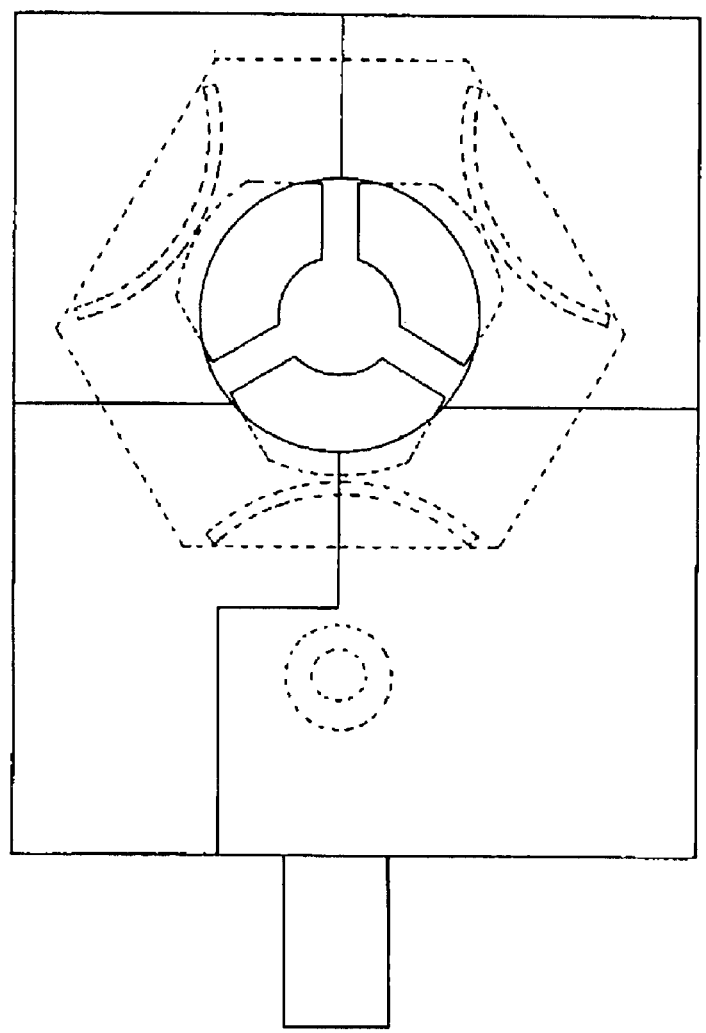
FIG. 22 shows the guide module, from the back side, without the guide pin installed and the guide socket removed with the latching devices in the "closed" position.

FIG. 22 illustrates the latching devices in the normal position.

FIG. 23 is the same as FIG. 22 with the guide socket in place with the latching devices in the "closed position".

Figure 24:
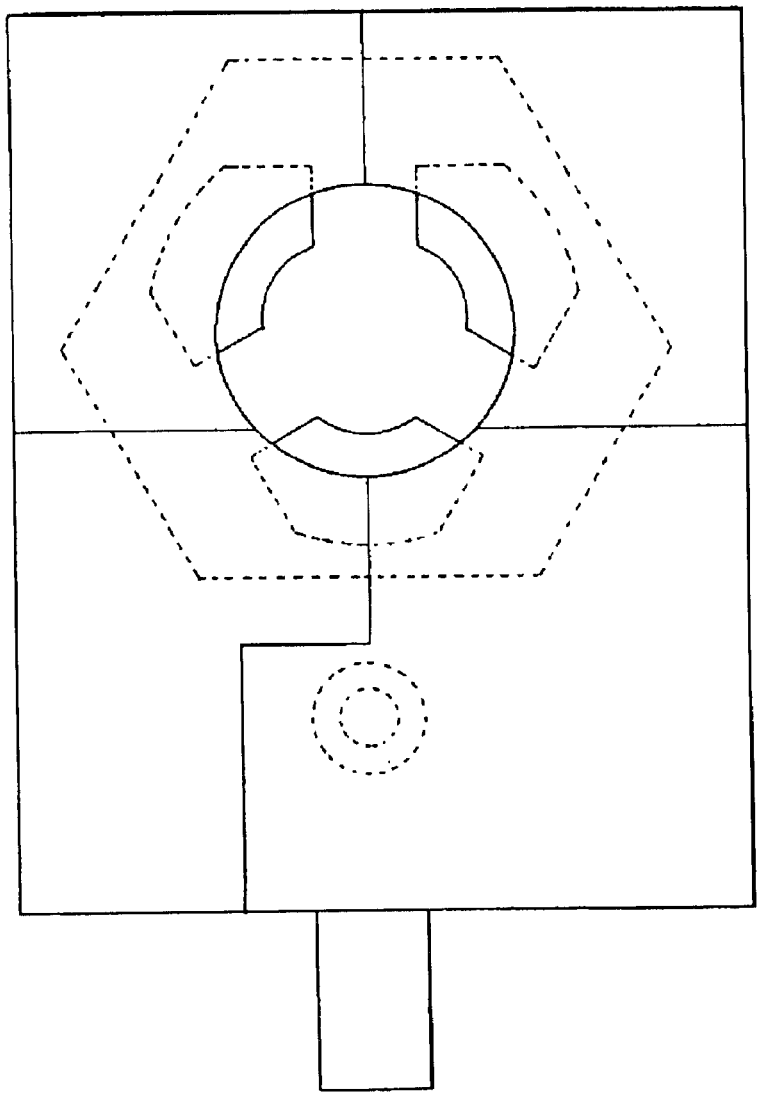
FIG. 24 is a view from the same direction as in FIGS. 21–23. It illustrates the latching devices in the full "open" position during the mating cycle.

FIG. 24 is a view from the same direction as in FIGS. 21–23. It illustrates the latching devices in the full "open" position during the mating cycle.

Figure 25:
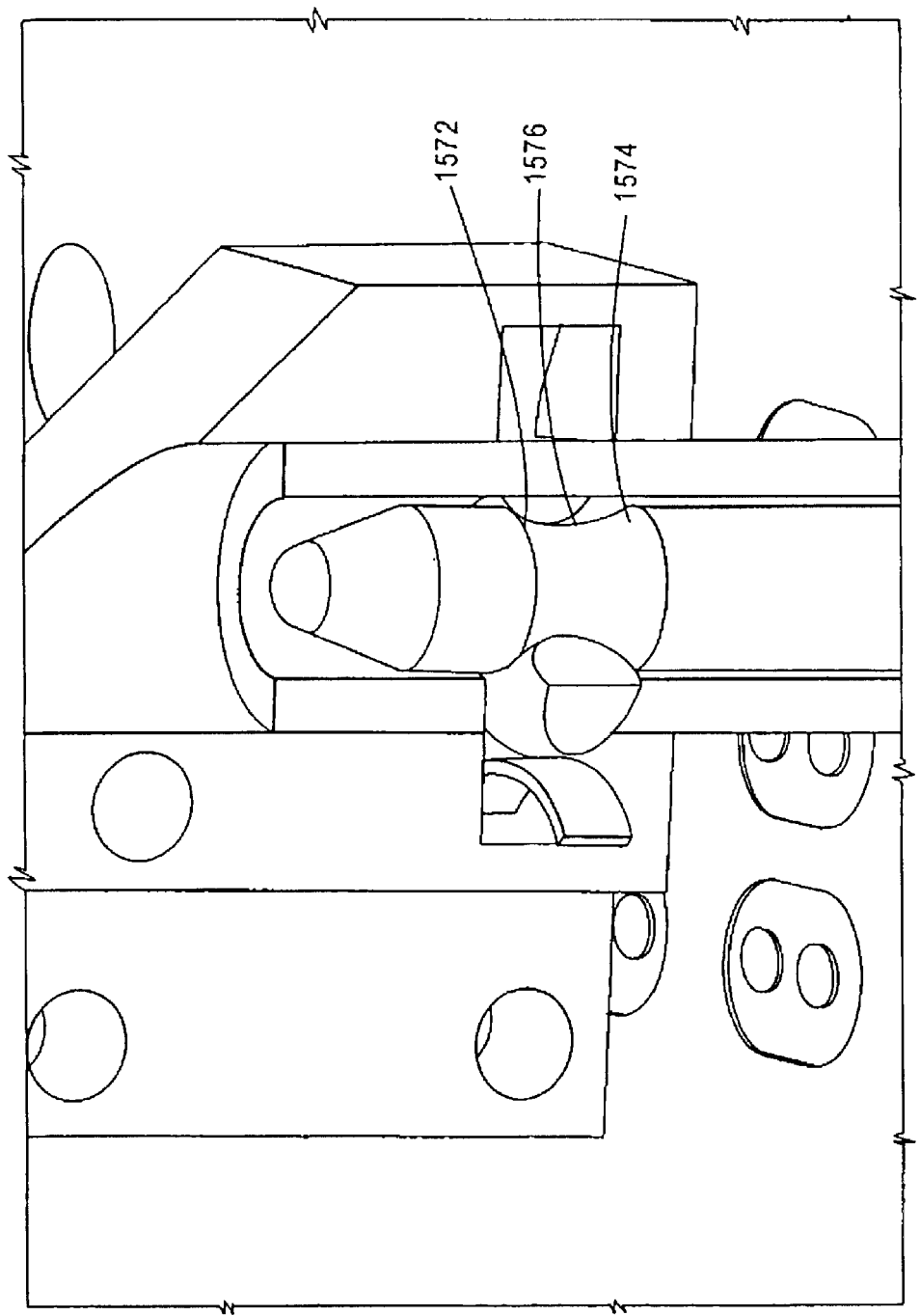
FIG. 25 is a perspective view with the guide pin engaged with a latching device and the cable housing and some latching devices and springs omitted for clarity.

FIG. 25 is a perspective view with the guide pin engaged with a latching device and the cable housing and some latching devices and springs omitted for clarity.

Advantageously, the spring members 1562–1566 and latching devices 1522–1526 and the shape of the guide pin are designed to mate electrical connector to the backpanel 22 with a minimum of force. The groove 1552 and the guide pin 1501 and the springs 1562–1566 are designed to require more force to separate the components than the force generated by the compression contacts against the PC board. Other options for construction can be accomplished using spring members with another type of spring such as a garter spring (extension coil). The latching devices shown and described have a cylindrical cross-section but the cylindrical cross-section may be replaced with a spherical ball component. The groove in the guide pin is shown as having a cliche closely matching the latching device shaved but may be replaced with a simple "V" groove for retention.

As depicted in FIG. 26, the entire latching device can be replaced with a single garter spring 2602. The garter spring 2602 is retained in grooves 1512, 1514 of blocks 1502, 1504. The spring 2602 works similarly to the latching device described with respect to FIG. 15 but is considerably simpler in terms of assembly. During operation, the garter spring 2602 remains in the grooves 1512, 1514. When the electrical connector is fully engaged with the guide pin 1048, the garter spring 2602 will be retained in the annular groove 1552 thereby maintaining the electrical connector in a mated position with the printed circuit board.

It is anticipated that the electrical connector according to the present invention can provide in the range of 80 twinax lines per linear inch in a 20 millimeter card slot. For radio frequency coaxial applications, this connector can be used in the single ended configuration at frequencies to 10 Gb/sec and higher. While these connectors have been described as advantageous to use in backplane systems these connectors also find applicability in many other applications where printed circuits are required to have high density electrical interconnects between adjacent printed circuit boards.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. A twinax electrical connector, comprising:
   a twinax cable having two electrical conductors spaced from each other and having a dielectric surrounding said two electrical conductors and an electrically conductive jacket surrounding said dielectric, said two electrical conductors each having exposed opposite ends;
   a first plurality of shielding members in electrical contact with one end of said electrically conductive jacket;
   a second plurality of shielding members in electrical contact with an opposite end of said electrically conductive jacket;
   a first set of conductive spring elements each in contact with a corresponding one exposed end of said two electrical conductors; and
   a second set of conductive spring elements each in contact with a corresponding second exposed end of said two electrical conductors.

2. The twinax electrical connector of claim 1, wherein said twinax connector carries signals having data speeds exceeding 5 Gb/sec.

3. The twinax electrical connector of claim 1, wherein the twinax cable has an elliptical cross-section.

4. The twinax electrical connector of claim 1, further comprising:
   a first interposer housing for receiving a portion of said first plurality of shielding members;
   a second interposer housing for receiving a portion of said second plurality of shielding members;
   a first retaining sheet for retaining said first plurality of shielding members and said first conductive spring elements;
   a second retaining sheet for retaining said second plurality of shielding members and said second conductive spring elements;
   a first movable interposer slide for receiving another portion of said first plurality of shielding members;
   a second movable interposer slide for receiving another portion of said second plurality of shielding members.

5. The twinax electrical connector of claim 1, wherein said shielding members are conductive spring elements.

6. The twinax electrical connector of claim 1, further comprising a cable housing for housing said twinax cable.

7. The twinax electrical connector of claim 1, wherein said conductive spring elements are conductive springs.

8. The twinax electrical connector of claim 1, wherein said at least one conductive spring element is positioned between said exposed end and a conductive pad on a printed circuit board such that the conductive spring element is compressed and retains approximately the same inductance as said two electrical conductors.

9. The twinax electrical connector of claim 1, wherein said electrical connector has an impedance of approximately 100 ohms.

10. The twinax electrical connector of claim 1, wherein said second plurality of shielding members provide 360 degree shielding of said opposite end of said electrically conductive jacket.

11. The twinax electrical connector of claim 1, wherein said second plurality of shielding members provide less than 360 degree shielding of said opposite end of said electrically conductive jacket.

12. An electrical connector having a plurality of twinax cables arranged in a vertical and horizontal array, comprising:
   a first set of twinax cables arranged in a vertical array and spaced from each other;
   each twinax cable having a pair of conductors, a dielectric layer and an electrically conductive jacket;
   a second set of twinax cables arranged in a vertical array and spaced from each other and horizontally spaced from said first set of twinax cables;
   a first plurality of conductive spring elements each positioned against a corresponding conductor;
   a second plurality of conductive spring elements each positioned against a corresponding conductor;
   a cable housing for retaining said first set and said second set of twinax cables;
   a first interposer on one side of said cable housing for receiving one end of said first set and said second set of twinax cables;
   a second interposer on another side of said cable housing for receiving an opposite end of said first set and said second set of twinax cables;
   a first retaining sheet for retaining signal spring contacts in contact with each pair of conductors on said one end of said first and second set of twinax cables;
   a second retaining sheet for retaining signal spring contacts in contact with each pair of conductors on said opposite end of said first and second set of twinax cables;
   a first interposer slide biased in a direction away from said first interposer and receiving an opposite end of said signal conductors and having a retracted position and a normal extended position;
   a second interposer slide biased in a direction away from said second interposer and receiving an opposite end of said signal conductors and having a retracted position and an extended position;
   wherein said conductive spring elements retained by said first retaining sheet and said second retaining sheet are protected by said first interposer slide and said second interposer slide, respectively, when each is in said retracted position and wherein said first plurality and said second plurality of conductive spring elements extend beyond said first interposer slide and said second interposer slide respectively when each is in said normal extended position.

13. The electrical connector of claim 12, wherein the first plurality and the second plurality of conductive spring elements are fuzz buttons.

14. The electrical connector of claim 12, wherein said electrical connector carries signals having data speeds exceeding 5 Gb/sec.

15. The electrical connector of claim 12, wherein the twinax cable has an elliptical cross-section.

16. The electrical connector of claim 12, further comprising a cable housing for housing said twinax cable.

17. The electrical connector of claim 12, wherein said electrical connector has an impedance of approximately 100 ohms.

18. The electrical connector of claim 12, wherein said second plurality of shielding members provide 360.degree. shielding of said central cable.

19. The electrical connector of claim 12, wherein said second plurality of shielding members provide less than 360.degree. shielding of said central cable.

20. An electrical interconnect system, comprising:
at least one cable having at least one central conductor and a conductive outer jacket with an insulator therebetween;
a set of cable housings retaining said at least one cable;
a first interposer cable housing having a first plurality of through holes corresponding to said at least one central conductor and a second plurality of holes partially overlapped in a radial direction with a respective one of said conductive outer jackets;
a second interposer cable housing having a third plurality of through holes corresponding to said at least one central conductor and a fourth plurality of holes partially overlapped in a radial direction with a respective one of said conductive outer jackets;
a first plurality of electrically conductive spring elements for insertion into said first plurality of through holes in said first interposer;
a second plurality of electrically conductive spring elements for insertion into said second plurality of holes in said first interposer;
a first interposer slide including a first interposer cable housing having a first plurality of through holes corresponding to said at least one central conductor and a second plurality of holes partially overlapped in a radial direction with a respective one of said conductive outer jackets;
a first retainer positioned between said first interposer cable housing and said first interposer slide for retaining said first plurality of electrically conductive spring elements and said second plurality of electrically conductive spring elements;
a second interposer cable housing having a third plurality of through holes corresponding to said at least one central conductor and a fourth plurality of holes partially overlapped in a radial direction with a respective one of said conductive outer jackets;
a third plurality of electrically conductive elements for insertion into said third plurality of through holes in said second interposer;
a fourth plurality of electrically conductive elements for insertion into said fourth plurality of holes in said second interposer;
a second interposer slide including a third interposer cable housing having a third plurality of through holes corresponding to said at least one central conductor and a fourth plurality of holes partially overlapped in a radial direction with a respective one of said conductive outer jackets;
a second retainer positioned between said second interposer cable housing and said second interposer slide for retaining said third plurality of electrically conductive spring elements and said fourth plurality of electrically conductive spring elements.

21. The electrical interconnect of claim 20, wherein first plurality and the second plurality of conductive spring elements are fuzz buttons.

22. A twinax electrical connector including a latching device, comprising:
a twinax cable having two electrical conductors spaced from each other and having a dielectric surrounding said two electrical conductors and an electrically conductive jacket surrounding said dielectric, said two electrical conductors each having exposed opposite ends;
a first plurality of shielding members in electrical contact with one end of said electrically conductive jacket;
a second plurality of shielding members in electrical contact with an opposite end of said electrically conductive jacket;
a first set of conductive spring elements each in contact with a corresponding one exposed end of said two electrical conductors;
a second set of conductive spring elements each in contact with a corresponding second exposed end of said two electrical conductors; and
a latching device for latching onto a guide pin.

23. The twinax electrical connector of claim 22, wherein the first plurality and the second plurality of conductive spring elements are fuzz buttons.

24. An electrical connector having a plurality of twinax cables arranged in a vertical and horizontal array and having a latching mechanism, comprising:
a first set of twinax cables arranged in a vertical array and spaced from each other;
each twinax cable having a pair of conductors, a dielectric layer and an electrically conductive jacket;
a second set of twinax cables arranged in a vertical array and spaced from each other and horizontally spaced from said first set of twinax cables;
a first plurality of conductive spring elements each positioned against a corresponding conductor;
a second plurality of conductive spring elements each positioned against a corresponding conductor;
a cable housing for retaining said first set and said second set of twinax cables;
a first interposer on one side of said cable housing for receiving one end of said first set and said second set of twinax cables;
a second interposer on another side of said cable housing for receiving an opposite end of said first set and said second set of twinax cables;
a first retaining sheet for retaining signal spring contacts in contact with each pair of conductors on said one end of said first and second set of twinax cables;
a second retaining sheet for retaining signal spring contacts in contact with each pair of conductors on said opposite end of said first and second set of twinax cables;
a first interposer slide biased in a direction away from said first interposer and receiving an opposite end of said signal conductors and having a retracted position and a normal extended position;
a second interposer slide biased in a direction away from said second interposer and receiving an opposite end of said signal conductors and having a retracted position and an extended position;
wherein said conductive spring elements retained by said first retaining sheet and said second retaining sheet are protected by said first interposer slide and said second interposer slide, respectively when each is in said retracted position and wherein said first plurality and said second plurality of conductive spring elements extend beyond said first interposer slide and said second interposer slide respectively when each is in said normal extended position;

a latching mechanism including a latching device in the housing for latching onto the guide pin.

25. A twinax electrical connector, comprising:

a twinax cable having two electrical conductors spaced from each other and having a dielectric surrounding said two electrical conductors and an electrically conductive jacket surrounding said dielectric, said two electrical conductors each having exposed opposite ends;

a first plurality of shielding members in electrical contact with one end of said electrically conductive jacket;

a second plurality of shielding members in electrical contact with an opposite end of said electrically conductive jacket;

a first set of conductive spring elements each in contact with a corresponding one exposed end of said two electrical conductors;

a second set of conductive spring elements each in contact with a corresponding second exposed end of said two electrical conductors;

a first interposer housing for receiving a portion of said first plurality of shielding members;

a second interposer housing for receiving a portion of said second plurality of shielding members;

a first retaining sheet for retaining said first plurality of shielding members and said first conductive spring elements;

a second retaining sheet for retaining said second plurality of shielding members and said second conductive spring elements;

a first movable interposer slide for receiving another portion of said first plurality of shielding members; and a second movable interposer slide for receiving another portion of said second plurality of shielding members.

26. The twinax electrical connector of claim 25, wherein said twinax connector carries signals having data speeds exceeding 5 Gb/sec.

27. The twinax electrical connector of claim 25, wherein the twinax cable has an elliptical cross-section.

28. The twinax electrical connector of claim 25, wherein said exposed opposite ends of said twinax cable extend into said first and said second interposers, respectively.

* * * * *